(12) United States Patent
Youn et al.

(10) Patent No.: US 9,087,602 B2
(45) Date of Patent: Jul. 21, 2015

(54) VOLATILE MEMORY DEVICE CAPABLE OF RELIEVING DISTURBANCES OF ADJACENT MEMORY CELLS AND REFRESH METHOD THEREOF

(71) Applicant: Samsung Electronics Co., Ltd., Suwon-si (KR)

(72) Inventors: Jae-Youn Youn, Seoul (KR); Su-A Kim, Seongnam-si (KR); Chul-Woo Park, Yongin-si (KR); Young-Soo Sohn, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/219,374

(22) Filed: Mar. 19, 2014

(65) Prior Publication Data
US 2014/0355332 A1 Dec. 4, 2014

(30) Foreign Application Priority Data

May 30, 2013 (KR) ......................... 10-2013-0061979

(51) Int. Cl.
*G11C 7/20* (2006.01)
*G11C 11/406* (2006.01)
(52) U.S. Cl.
CPC .............................. *G11C 11/40615* (2013.01)
(58) Field of Classification Search
CPC ........... G11C 11/406; G11C 11/40611; G11C 11/40615

USPC .................... 365/149, 230.03, 222, 51, 63
See application file for complete search history.

(56) References Cited

U.S. PATENT DOCUMENTS

| | | | | |
|---|---|---|---|---|
| 5,379,400 | A | * | 1/1995 | Barakat et al. ................ 711/106 |
| 5,933,381 | A | | 8/1999 | Iwata |
| 6,005,810 | A | | 12/1999 | Wu |
| 6,219,292 | B1 | | 4/2001 | Jang |
| 6,772,352 | B1 | | 8/2004 | Williams et al. |
| 6,781,908 | B1 | * | 8/2004 | Pelley et al. ................... 365/222 |
| 7,193,917 | B2 | * | 3/2007 | Takahashi et al. ............. 365/222 |
| 7,742,355 | B2 | | 6/2010 | Kohler et al. |
| 7,778,078 | B2 | | 8/2010 | Nagadomi et al. |
| 2006/0291311 | A1 | | 12/2006 | Won et al. |
| 2008/0165605 | A1 | | 7/2008 | Fisch et al. |
| 2009/0046531 | A1 | | 2/2009 | Noh et al. |
| 2010/0165773 | A1 | | 7/2010 | Lim et al. |
| 2012/0163111 | A1 | | 6/2012 | Shim |
| 2012/0300568 | A1 | | 11/2012 | Park et al. |

FOREIGN PATENT DOCUMENTS

| | | |
|---|---|---|
| JP | 11-096755 | 4/1999 |
| KP | 10-2012-0131423 A | 12/2012 |
| KR | 10-2000-0045401 A | 7/2000 |
| KR | 10-2002-0025811 A | 4/2002 |
| KR | 10-0652414 B1 | 11/2006 |

(Continued)

*Primary Examiner* — Andrew Q Tran
(74) *Attorney, Agent, or Firm* — Muir Patent Law, PLLC

(57) ABSTRACT

Provided is a refresh method of a volatile memory device. The method includes: detecting a number of disturbances that affect a second memory area as the number of accesses to a first memory area is increased; outputting an alert signal from the volatile memory device to an outside of the volatile memory device when the detected number of disturbances reach a reference value; and performing a refresh operation on the second memory area in response to the alert signal.

20 Claims, 25 Drawing Sheets

(56) References Cited

FOREIGN PATENT DOCUMENTS

| KR | 10-2007-0035436 A | 3/2007 |
| KR | 10-0855578 B1 | 8/2008 |
| KR | 10-2010-0076092 A | 7/2010 |
| KR | 10-2012-0075322 A | 7/2012 |
| WO | WO 2008-085701 A2 | 7/2008 |

* cited by examiner

VOLATILE MEMORY DEVICE CAPABLE OF RELIEVING DISTURBANCES OF ADJACENT MEMORY CELLS AND REFRESH METHOD THEREOF

CROSS-REFERENCE TO RELATED APPLICATIONS

This U.S. non-provisional patent application claims priority under 35 U.S.C. §119 to Korean Patent Application No. 10-2013-0061979, filed on May 30, 2013, the entire contents of which are hereby incorporated by reference.

BACKGROUND

The present disclosure herein relates to a semiconductor memory device, and more particularly, to a volatile memory device outputting an alert signal by detecting a number of disturbances and performing a refresh operation and a refresh method thereof.

Semiconductor memory devices may be generally classified into volatile memory devices and non-volatile memory devices. A volatile memory device has faster read and write speeds but loses its stored content when there is no external power supply. On the contrary, a non-volatile memory device retains its stored data even when there is no power supply.

In order to meet user's demands for high performance, a capacity and speed of a semiconductor memory device used in various electronic systems are drastically increased. A representative example of the volatile memory device includes Dynamic Random Access Memory (DRAM). The DRAM stores data by using charges in a cell capacitor. Since the charges stored in the cell capacitor may leak as time elapses, the DRAM has finite data retention characteristics.

According to the finite data retention characteristics, in order to maintain the stored data, a refresh operation is performed. The DRAM maintains the data stored in the cell capacitor through the refresh operation. As the degree of integration is increased and manufacturing techniques are developed, a distance between cells of the DRAM becomes gradually narrower. Also, due to the reduction of the distance between cells, disturbance from adjacent cells or word lines serves as an important data integrity factor. Even when the disturbance affects a specific cell intensively, it is difficult for a random access memory such as DRAM to limit an access to a specific address. Therefore, disturbance may occur in a specific cell, and this affects refresh characteristics thereof.

SUMMARY

The present disclosure provides a volatile memory device performing or inducing a refresh operation even when disturbance occurs intensively in a specific cell of the volatile memory device, and a refresh method thereof.

Some exemplary embodiments provide a refresh method of a volatile memory device, the method may include: detecting a number of disturbances that affect a second memory area as the number of accesses to a first memory area is increased; outputting an alert signal from the volatile memory device to an outside of the volatile memory device when the detected number of disturbances reach a reference value; and performing a refresh operation on the second memory area in response to the alert signal.

In some embodiments, the performing the refresh operation on the second memory area may include receiving a refresh command provided from a memory controller in response to the alert signal.

In other embodiments, the performing the refresh operation on the second memory area may include: performing a refresh operation on memory cells connected to a first word line of the second memory area; and performing a refresh operation on memory cells connected to a second word line of the second memory area, the second memory area is located adjacent to the first memory area.

In still other embodiments, the performing the refresh operation on the second memory area may include: receiving a first refresh command provided from a memory controller in response to the alert signal; and receiving a second refresh command subsequently to the first refresh command from the memory controller.

In even other embodiments, the performing of the refresh operation on the second memory area may include: performing a refresh operation on memory cells connected to a first word line of the second memory area in response to the first refresh command; and performing a refresh operation on memory cells connected to a second word line of the second memory area in response to the second refresh command, the second memory area is located adjacent to the first memory area.

In yet other embodiments, the method may further include: storing an address related to the first memory area or the second memory area in a register, the performing the refresh operation on the second memory area may include outputting the address by receiving a mode register read command from the outside of the volatile memory device.

In further embodiments, the method may further include, after the receiving of the mode register read command, receiving at least a one-time refresh command provided from a memory controller.

In still further embodiments, the performing of the refresh operation on the second memory area may include: in response to the at least the one-time refresh command, performing a per bank refresh operation on memory cells connected to a first word line of the second memory area; and performing a per bank refresh operation on memory cells connected to a second word line of the second memory area, the second memory area is located adjacent to the first memory area.

In even further embodiments, the alert signal may be outputted as a pulse signal having a specific pulse width.

In yet further embodiments, the alert signal may be shifted from a first logic level to a second logic level when the detected number of disturbances reach the reference value, and may be shifted from the second logic level to the first logic level when the refresh operation on the second memory area is completed.

In yet further embodiments, the number of disturbances that affect the second memory area may correspond to a number of active commands on the first memory area.

In other embodiments, a volatile memory device may include: a cell array including a plurality of DRAM cells; a disturbance detector configured to count a number of accesses to a first memory area of the cell array and generate a detect signal when the number of the counted accesses reaches a reference value; a refresh control logic configured to, in response to the detect signal, perform a refresh operation on a second memory area and a third memory area of the cell array, each being located adjacent to the first memory area; and an alert generator configured to, in response to the detect signal, output an alert signal from the volatile memory device to an outside of the volatile memory device.

In some embodiments, the refresh control logic may be configured to perform the refresh operation on the second and third memory areas either in response to a refresh command provided from the outside of the volatile memory device, or without a refresh command from the outside of the volatile memory device.

In other embodiments, the disturbance detector may be configured to count the number of accesses on the first memory area for a specific period of time.

In still other embodiments, the alert signal may be shifted from a first logic level to a second logic level in response to the detect signal, and may be shifted from the second logic level to the first logic level when the refresh operation on the second memory area and the third memory area is completed.

In still other embodiments, a method of operating a memory device may include: counting a number of times that a first set of memory cells of the memory cell array is accessed during a first time period; when the counted number of times equal to a reference number is detected, activating an alert signal for a period of time and outputting the alert signal from the memory device to the outside of the memory device; and performing a refresh operation on a second set of memory cells of the memory cell array, the second set of memory cells is located adjacent to the first set of memory cells.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
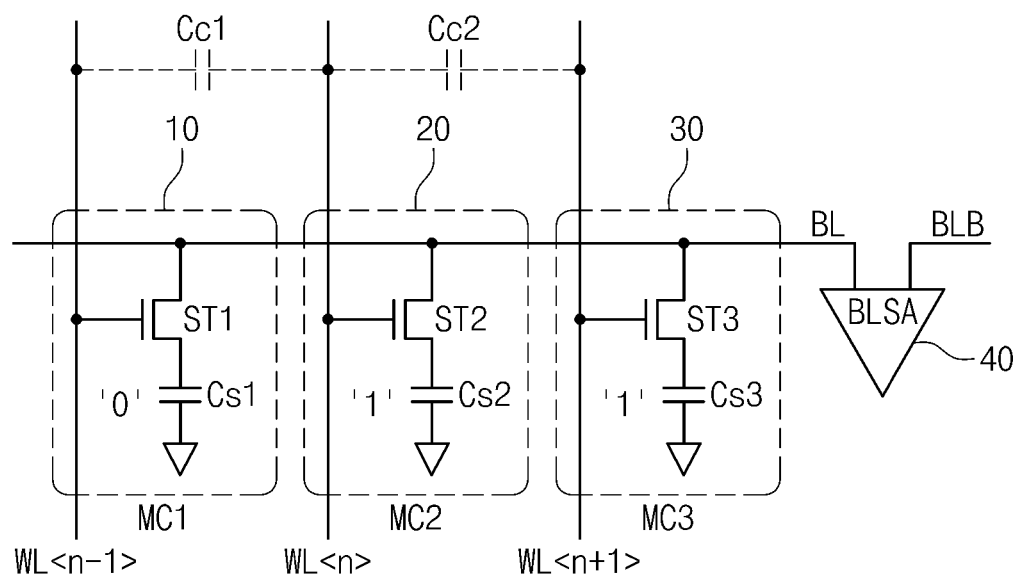
FIG. 1 is a circuit diagram illustrating disturbance between cells of a volatile memory device.

Exemplary embodiments will be described below in more detail with reference to the accompanying drawings. The inventive concept may, however, be embodied in different forms and should not be construed as limited to the embodiments set forth herein. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms unless the context indicates otherwise. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Below, a Synchronous Dynamic Random Access Memory (SDRAM) is used as one example for illustrating characteristics and functions of the disclosure. However, those skilled in the art can easily understand other advantages and performances of the disclosure according to the descriptions. The inventive concept may be embodied or applied through other embodiments. In addition, the detailed description may be amended or modified according to viewpoints and applications, not being out of the scope, technical idea and other objects of the inventive concept.

Hereinafter, exemplary embodiments will be described in detail with reference to the accompanying drawings.

FIG. 1 is a circuit diagram illustrating disturbance between cells of a volatile memory device. Referring to FIG. 1, a part of the volatile memory device includes memory cells 10, 20, and 30 and a bit line sense amplifier 40.

It is assumed that each of the memory cells 10, 20, and 30 is connected to the same bit line BL. Also, the memory cell 10 is connected to a word line WL<n−1>, the memory cell 20 is connected to a word line WL<n>, and the memory cell 30 is connected to a word line WL<n+1>. As shown in FIG. 1, the word lines WL<n−1> and WL<n+1> are located adjacent to the word line WL<n>. The memory cell 10 includes an access transistor ST1 and a cell capacitor Cs1. A gate terminal of the access transistor ST1 is connected to the word line WL<n−1> and its one terminal is connected to the bit line BL. The memory cell 20 includes an access transistor ST2 and a cell capacitor Cs2. A gate terminal of the access transistor ST2 is connected to the word line WL<n> and its one terminal is connected to the bit line BL. Also, the memory cell 30 includes an access transistor ST3 and a cell capacitor Cs3. A gate terminal of the access transistor ST3 is connected to the word line WL<n+1> and its one terminal is connected to the bit line BL.

The bit line sense amplifier 40 may include an N sense amplifier NSA discharging a low level bit line among bit lines BL and BLB and a P sense amplifier PSA charging a high level bit line among the bit lines BL and BLB. During a refresh operation, the bit line sense amplifier 40 rewrites data stored through the N sense amplifier NSA or the P sense amplifier PSA in a selected memory cell.

During a read operation or a write operation, a select voltage (for example, Vpp) is provided to the word line WL<n>. Then, due to capacitive coupling effect, a voltage of adjacent word lines WL<n−1> and WL<n+1> rises even when no select voltage is applied. Such capacitive coupling is indicated with parasitic capacitances Cc1 and Cc2. During no refresh operation, when the word line WL<n> is accessed repeatedly, charges stored in the cell capacitors Cs1 and Cs3 of the memory cells 10 and 30 connected to the word lines WL<n−1> and WL<n+1> may leak gradually. In this case, the reliability of a logic '0' stored in the cell capacitor Cs1 and a logic '1' stored in the cell capacitor Cs3 may not be guaranteed. Accordingly, a refresh operation on memory cells connected to the word lines WL<n−1> and WL<n+1> is needed at an appropriate time.

According to an embodiment, when it is determined that a refresh operation on memory cells connected to the word lines WL<n−1> and WL<n+1> is needed, information on a such an internal status may be provided to the outside of a volatile memory device. Through generation or output of such status information, the volatile memory device may induce a refresh command from the outside or may compulsorily execute a refresh operation internally.

Figure 2:
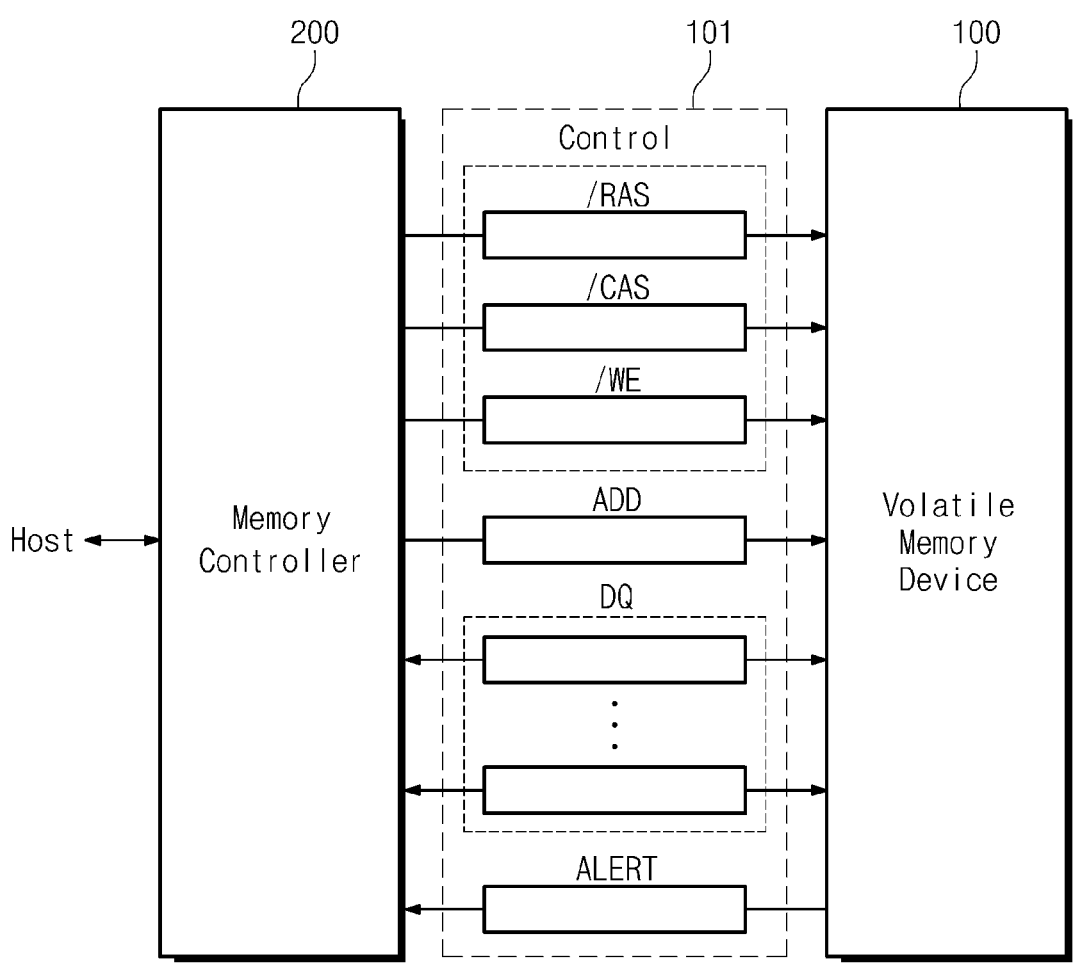
FIG. 2 is a block diagram of a memory system according to one embodiment.

FIG. 2 is a block diagram of a memory system according to an embodiment. Referring to FIG. 2, the memory system includes a volatile memory device 100 and a memory controller 200.

In one embodiment, the volatile memory device 100 may detect that disturbance is concentrated at a specific address in an operation period at which no refresh operation is performed. In one embodiment, the volatile memory device 100 may detect that disturbance is concentrated at a specific address in an operation period at which an occurrence frequency of a refresh operation is relatively low. When the number of the detected disturbances is greater than a threshold (e.g., a reference number), the volatile memory device 100 outputs an alert signal ALERT to the outside. Here, the alert signal ALERT may be a signal outputted through a specific pin or status data outputted in a data form.

In one embodiment, after outputting the alert signal ALERT to the outside, the volatile memory device 100 may receive a refresh command from the memory controller 200. The volatile memory device 100 may perform a refresh operation at least two times in response to the refresh command. For example, a refresh operation may be continuously performed on word lines adjacent to a word line at which disturbance is concentrated. The volatile memory device 100 may perform a refresh operation on the word lines WL<n−1> and WL<n+1> of FIG. 1 in response to the refresh command from the memory controller 200. In one embodiment, after outputting the alert signal ALERT to the outside, the volatile memory device 100 may perform a refresh operation by itself without receiving the refresh command from the memory controller 200.

In one embodiment, a plurality of memory cells connected to the word lines WL<n> of FIG. 1 may be referred to as a first memory area and a plurality of memory cells connected to the word lines WL<n−1> and WL<n+1> of FIG. 1 may be referred to as a second memory area. As such, the second memory area may be located adjacent to the first memory area. In another embodiment, a plurality of memory cells connected to the word lines WL<n> of FIG. 1 may be referred to as a first memory area, a plurality of memory cells connected to the word lines WL<n−1> of FIG. 1 may be referred to as a second memory area, and a plurality of memory cells connected to the word lines WL<n+1> of FIG. 1 may be referred to as a third memory area. As such, the second and third memory areas may be located adjacent to the first memory area.

The memory controller 200 provides interfacing between a host and the volatile memory device 100. The memory controller 200 exchanges data and signals with the volatile memory device 100 through control signal lines /RAS, /CAS, and /WE, an address line ADD, and a data line DQ, and an alert signal line ALERT. Especially, the memory controller 200 may deliver a refresh command with reference to the alert signal ALERT provided from the volatile memory device 100. For example, when the alert signal ALERT outputted from the volatile memory device 100 is activated, the memory controller 200 may deliver an auto refresh command set to the volatile memory device 100 through control signals /RAS, /CAS, and /WE.

The memory controller 200 may deliver a command set to the volatile memory device 100 with reference to the control signals /RAC, /CAS, and /WE. In a typical DRAM, an active command and an auto refresh command are determined through a combination of control signals /CS, /RAC, /CAS, and /WE. Additionally, a self refresh command is identified through a combination of an auto refresh command and a clock enable signal CKE (not shown). However, a refresh command issued by the memory controller 200 is not limited to the above method.

When disturbance is concentrated at a specific memory area, a memory system including the volatile memory device 100 and the memory controller 200 may compulsorily perform a refresh operation on the disturbance concentrated memory area. For this, the volatile memory device 100 may detect the number or size of disturbance. When disturbance reaches a threshold, the volatile memory device 100 outputs the alert signal ALERT to the outside. Then, the memory controller 200 provides a refresh command to the volatile memory device 100 as determining the alert signal ALERT as a refresh request. As described above, the volatile memory 100 may internally perform a refresh operation on a memory area that is excessively exposed to disturbance without providing a refresh operation of the memory controller 200.

In one embodiment, the volatile memory device 100 may be a monolithic integrated circuit such as a semiconductor memory chip. Alternatively, volatile memory device 100 may comprise a group of chips in a semiconductor package, such as a stack of semiconductor memory chips. In this alternative, each of the chips may form memory cells 10, 20, and 30 and a bit line sense amplifier 40 of FIG. 1. An outside of the volatile memory device 100 may be connected to another semiconductor chip (e.g., memory controller), for example, through an I/O bus 101 as shown in FIG. 2.

Figure 3:
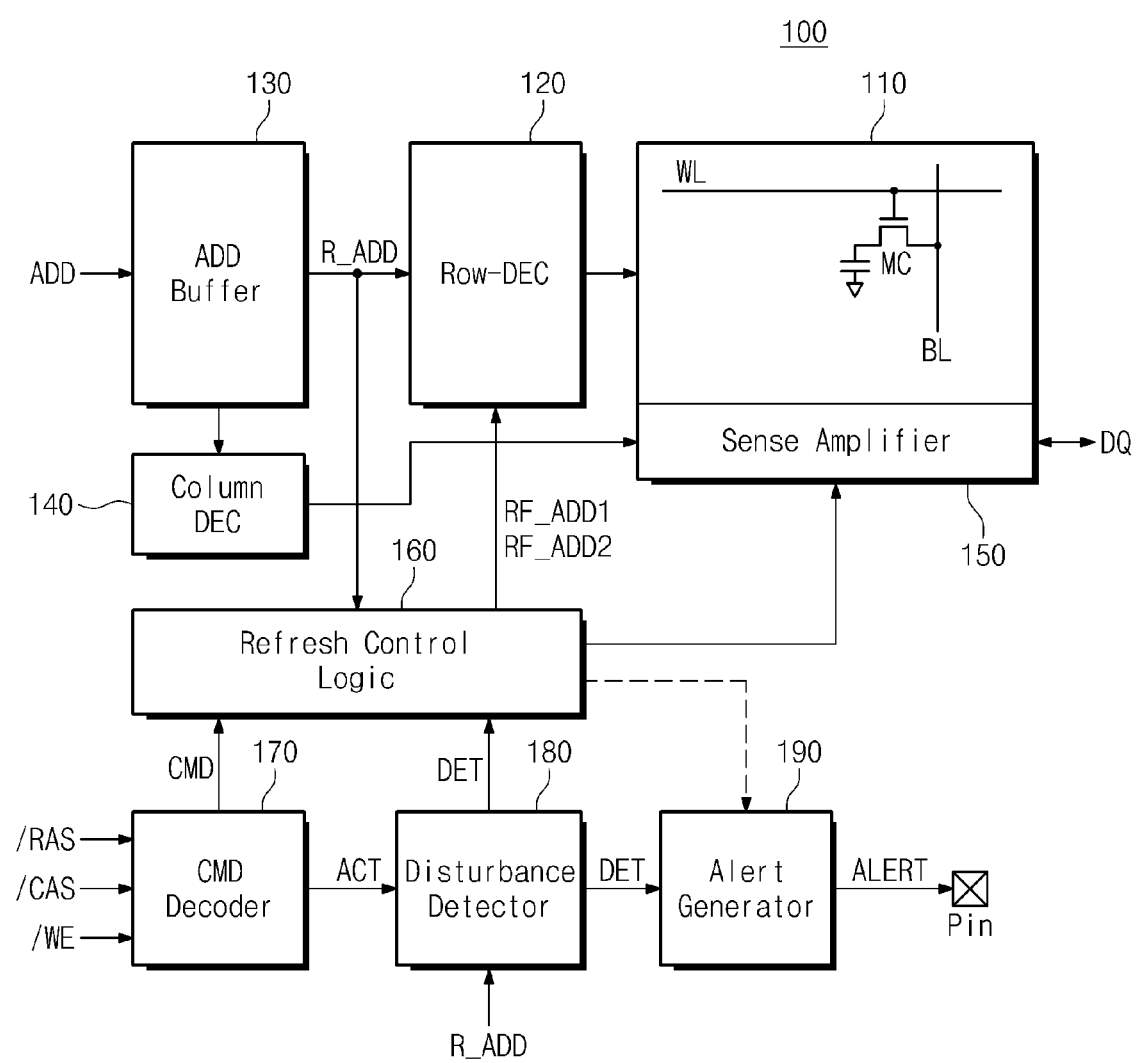
FIG. 3 is a block diagram of a volatile memory device according to an embodiment.

FIG. 3 is a block diagram of a volatile memory device according to one embodiment. Referring to FIG. 3, the volatile memory device 100 may include a cell array 110, a row decoder 120, an address buffer 130, a column decoder 140, a sense amplifier 150, a refresh control logic 160, a command decoder 170, a disturbance detector 180, and an alert generator 190.

In the cell array 110, each of a plurality of memory cells MCs is connected to a word line WL and a bit line BL and is arranged in a row direction and a column direction. Each memory cell may include a cell capacitor and an access transistor. A gate of an access transistor is connected to one of word lines arranged in a row direction. One terminal of an access transistor is connected to a bit line BL or a complementary bit line BLB, which are arranged in a row direction. The other terminal of an access terminal may be connected to a cell capacitor.

The row decoder 120 selects a word line of a memory cell to be accessed in response to an inputted address ADD. Additionally, the row decoder 120 decodes a row address occurring from an address counter (not shown) and enables a corresponding word line in a self refresh operation mode. The column decoder 140 may select a bit line of a memory cell during data input or output.

The address buffer 130 temporarily stores an address inputted from the outside. The address buffer 130 supplies a stored address to the row decoder 120 or the column decoder 140. An address ADD in an external signaling scheme is converted into one in an internal signaling scheme of the memory device 100 through the address buffer 130.

The sense amplifier 150 may write data in a memory cell selected through a selected bit line or sense already-written data. The sense amplifier 150 senses data stored in a memory cell through a bit line and outputs them. Additionally, the sense amplifier 150 may further include elements for storing input data in a selected memory cell. The sense amplifier 150 may rewrite data stored in a memory cell during a refresh operation. The sense amplifier 150 may perform a refresh operation on selected memory cells in response to a control of the refresh control logic 160. That is, the sense amplifier 150 amplifies data of memory cells selected for refresh and rewrites them. In order for such a refresh operation, the sense amplifier 150 may further include an N sense amplifier NSA discharging a low level bit line among bit lines BL and BLB and a P sense amplifier PSA charging a high level bit line among the bit lines BL and BLB.

The refresh control logic 160 controls a refresh operation of the volatile memory device 100 in response to a command outputted from the command decoder 170. A general auto refresh operation may be inputted through a combination of control signals /RAS, /CAS, and /WE. Then, a refresh operation is determined by the command decoder 170 and a refresh command is provided to the refresh control logic 160. Then, the refresh control logic 160 may control the row decoder 120 and the sense amplifier 150 to perform a refresh operation on a selected area. In order for a refresh operation, the refresh control logic 160 may further include an address counter to generate a row address.

The refresh control logic 160 may further include an internal register to store a row address R_ADD at which disturbance is concentrated. The refresh control logic 160 may store a row address R_ADD at the time of when a detect signal DET occurs from the disturbance detector 180 or addresses of adjacent rows among accessed row addresses. The refresh control logic 160 may perform a refresh operation on the row address R_ADD corresponding to the detect signal DET by itself or in response to an external refresh command.

The command decoder 170 determines an inputted command with reference to signals /RAC, /CAS, and /WE applied from the outside. In a typical DRAM, an active command and an auto refresh command are determined through a combination of signals /CS, /RAC, /CAS, and /WE. The command decoder 170 decodes an active command to provide it as an active signal ACT to the disturbance detector 180.

The disturbance detector 180 may count a number of disturbances on a specific memory area. For example, the disturbance detector 180 may count a number of occurrences of an active command on a specific word line or a specific memory area. The disturbance detector 180 may receive the number of occurrences of an active signal ACT provided from the command decoder 170. The disturbance detector 180 counts the number of occurrences of an active signal ACT on a specific memory area during a specific time. Then, when a count reaches a threshold, the disturbance detector 180 generates a detect signal DET. The detect signal DET is provided to the refresh control logic 160 and the alert generator 190.

The alert generator 190 generates an alert signal ALERT in response to the detect signal DET provided from the disturbance detector 180. The alert signal ALERT may be generated as a pulse signal outputted through an additional pin. For example, the alert signal ALERT may be set to be shifted into a 'Low' level at the time of when the detect signal DET is generated through a pin, and may be set to be shifted into a 'High' level at the completion time of a refresh operation on a detected area. The 'Low' and 'High' levels of the alert signal ALERT are interchangeable. Furthermore, the alert signal ALERT may be outputted as status data to the outside.

When disturbance occurring in a specific memory area reaches a threshold, the volatile memory device 100 outputs an alert signal ALERT to the outside. Furthermore, the volatile memory device 100 performs a refresh operation on a memory area where disturbance occurs according to a refresh command from the outside or internal generation of a refresh command.

Figure 4:
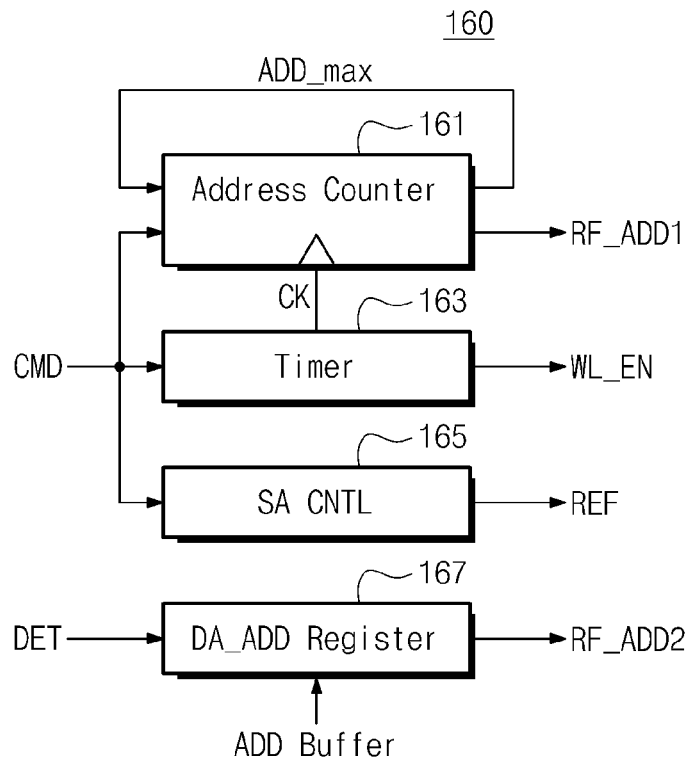
FIG. 4 is a block diagram illustrating a refresh control logic of FIG. 3 according to one embodiment.

FIG. 4 is a block diagram illustrating the refresh control logic of FIG. 3 according to one embodiment. Referring to FIG. 4, the refresh control logic 160 may include an address counter 161, a timer 163, a sense amplifier controller 165, and a disturbance address register 167.

The address counter 161 generates refresh addresses RF_ADD1, i.e., a target of a refresh operation, in response to a refresh command outputted from the command decoder 170 of FIG. 3. The address counter 161 may generate the refresh addresses RF_ADD1 to perform a refresh operation on an entire memory area in response to a refresh command provided from the outside. The address counter 161 sequentially generates addresses from a start address to an end address in response to a clock signal CK provided from the timer 163. At this point, when the end address ADD max is reached, the address counter 161 may reset a counting value to the start address.

The timer 163 generates a clock signal CK according to a predetermined period in response to a refresh command outputted from the command decoder 170. The timer 163 generates a word line enable signal WL_EN at each period predetermined by the command decoder 170. A word line of a selection area may be activated by the word line enable signal WL_EN.

In order for a refresh operation, the sense amplifier controller 165 generates a control signal REF for controlling the sense amplifier 150. The sense amplifier controller 165 controls the sense amplifier 150 to allow charges of cell capacitors and bit lines in selected memory cells to be shared and amplification and rewriting to occur.

The disturbance address register 167 may store an address corresponding to a detect signal DET in row addresses inputted from the address buffer 130. The disturbance address register 167 may temporarily store a row address whose active count reaches a threshold among inputted row addresses R_ADD. Also, two addresses adjacent to the stored row address are sequentially outputted as a second refresh address RF_ADD2. According to the second refresh address RF_ADD2, all bank refresh or per bank refresh may be performed on two rows.

Figure 5:
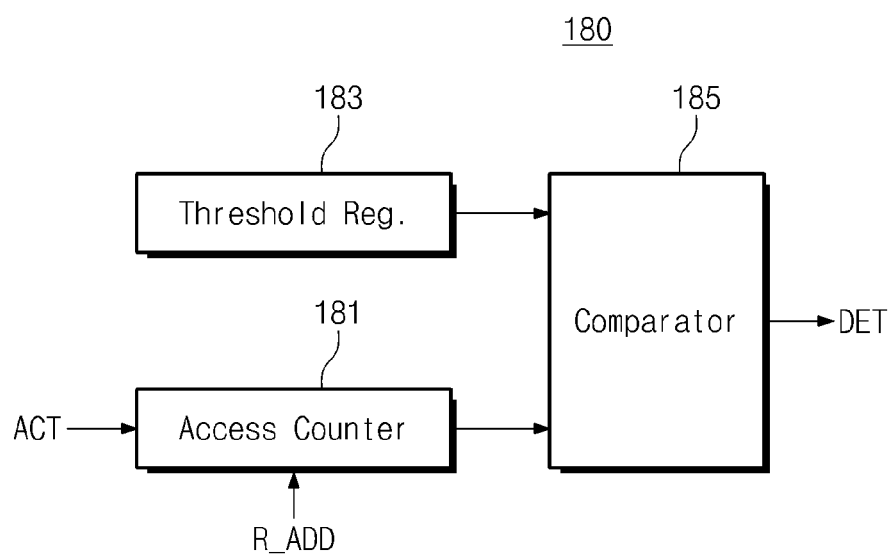
FIG. 5 is a block diagram illustrating a disturbance detector of FIG. 3 according to one embodiment.

FIG. 5 is a block diagram illustrating the disturbance detector of FIG. 3 according to one embodiment. The disturbance detector 180 may include an access counter 181, a threshold register 183, and a comparator 185.

The access counter 181 may count a number of active statuses on a specific address. For example, the access counter 181 may count the number of active statuses on a specific word line. The active commands may be counted on a specific word line or a word line group including at least two word lines. Moreover, a count of the number of active commands may be performed by a specific block unit, a bank unit, or a chip unit.

The threshold register 183 stores the maximum disturbance occurrence count that guarantees the reliability of data in a specific word line or a memory unit. For example, a threshold on one word line may be stored in the threshold register 183. Or, a threshold on one word line group, one block, one bank unit, or one chip unit may be stored in the threshold register 183.

The comparator 185 compares a threshold stored in the threshold register 183 with the number of active commands on a specific memory area counted by the access counter 181. If there is a memory area where the number of counted active commands reaches a threshold, the comparator 184 generates a detect signal DET.

Figure 6:
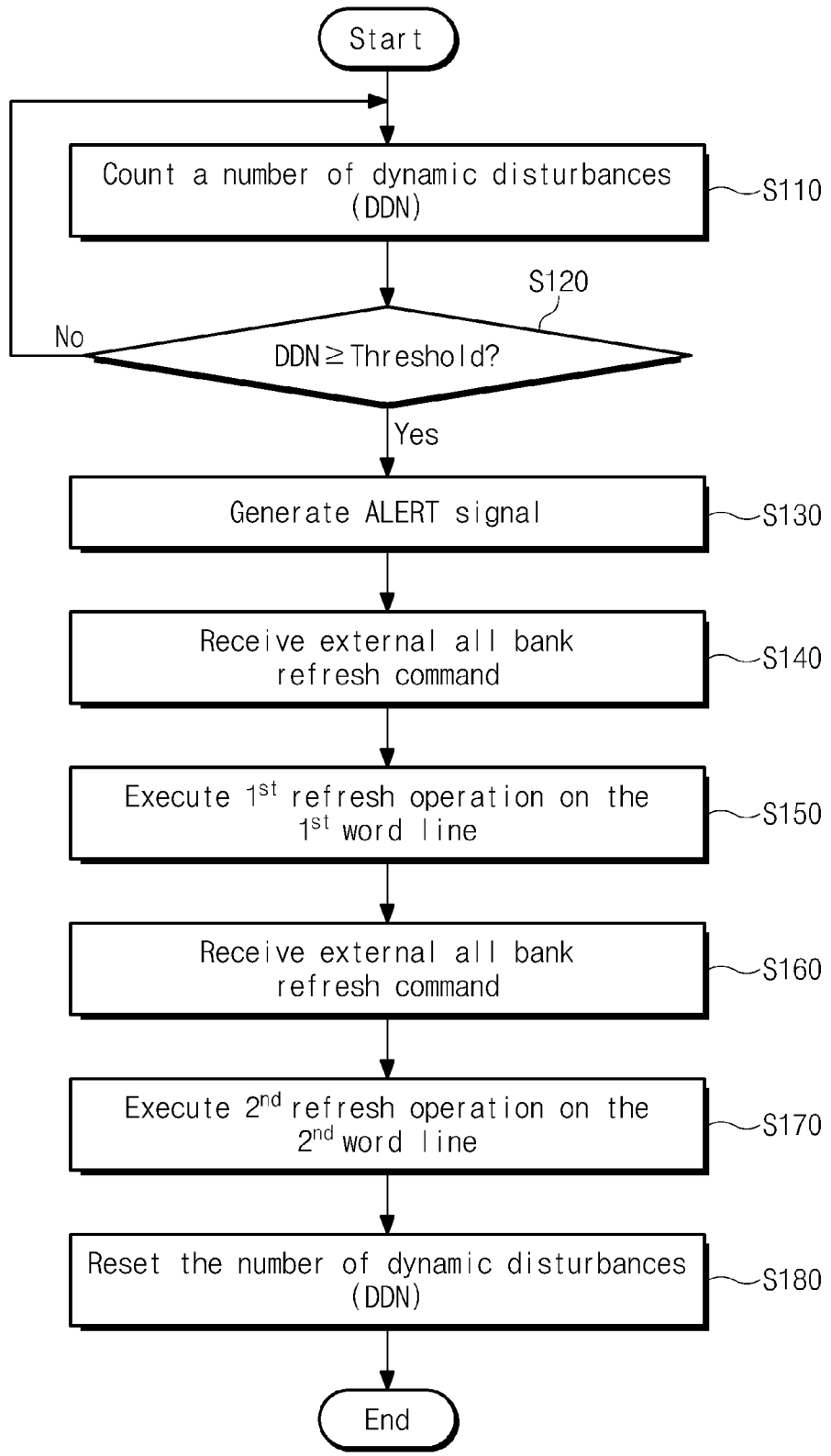
FIG. 6 is a flowchart illustrating a refresh method of a volatile memory device according to a first embodiment.

FIG. 6 is a flowchart illustrating a refresh method of a volatile memory device according to a first embodiment. Referring to FIG. 6, when it is detected that disturbance on a specific memory area reaches a threshold, the volatile memory device 100 outputs an alert signal ALERT.

In operation S110, the volatile memory device 100 of FIG. 3 counts a number of dynamic disturbances DDN on a specific memory area. For example, the volatile memory device 100 may count a number of active commands on a specific memory area. Here, a unit for counting the number of active commands may be a word line group unit including a plurality of word lines, a block unit, a bank unit, or a chip unit.

In operation S120, the volatile memory device 100 compares the number of counted dynamic disturbances DDN with a threshold. When the number of dynamic disturbances counted within a predetermined time is equal to or greater than a threshold, it proceeds to operation S130 for generating an alert signal ALERT. On the contrary, when the number of dynamic disturbances counted within a predetermined time is less than the threshold, it proceeds to operation S110 for continuously monitoring the number of dynamic disturbances DDN.

In operation S130, the alert generator 190 of FIG. 3 generates an alert signal ALERT in response to a detect signal DET from the disturbance detector 180. The alert generator 190 may output an alert signal ALERT, for example, in a pulse form to the outside of the volatile memory device 100 through a pin.

In operation S140, the memory controller 200 provides, for example, a first all bank refresh command to the volatile memory device 100. The volatile memory device 100 receives the first all bank refresh command provided from the memory controller 200 in response to the alert signal ALERT. On outputting the alert signal ALERT, the memory controller 200 applies an all bank refresh command to the volatile memory device 100 to compulsorily perform a refresh operation.

In operation S150, the volatile memory device 100 performs a first refresh operation on a first word line exposed to disturbance. For example, the volatile memory device 100 may perform a refresh operation on a respective first word line of all memory banks. Address information on the first word line may be provided by the disturbance address register 167 of FIG. 4.

In operation S160, the memory controller 200 provides a second all bank refresh command to the volatile memory device 100. Then, the volatile memory device 100 receives the second all bank refresh command.

In operation S170, the volatile memory device 100 performs a second refresh operation on a second word line exposed to disturbance. For example, the volatile memory device 100 may perform a refresh operation on the respective second word line of all memory banks. Address information on the second word line may be provided by the disturbance address register 167. Here, the first word line and the second word line may be word lines adjacent to a word line where the number of accesses (or, the number of active commands) exceeds a threshold.

In operation S180, a count value of the number of dynamic disturbances DDN on a memory area processed by a refresh operation may be reset.

A refresh method of a volatile memory device outputting an alert signal ALERT and receiving a refresh command from the outside is described above.

Figure 7:
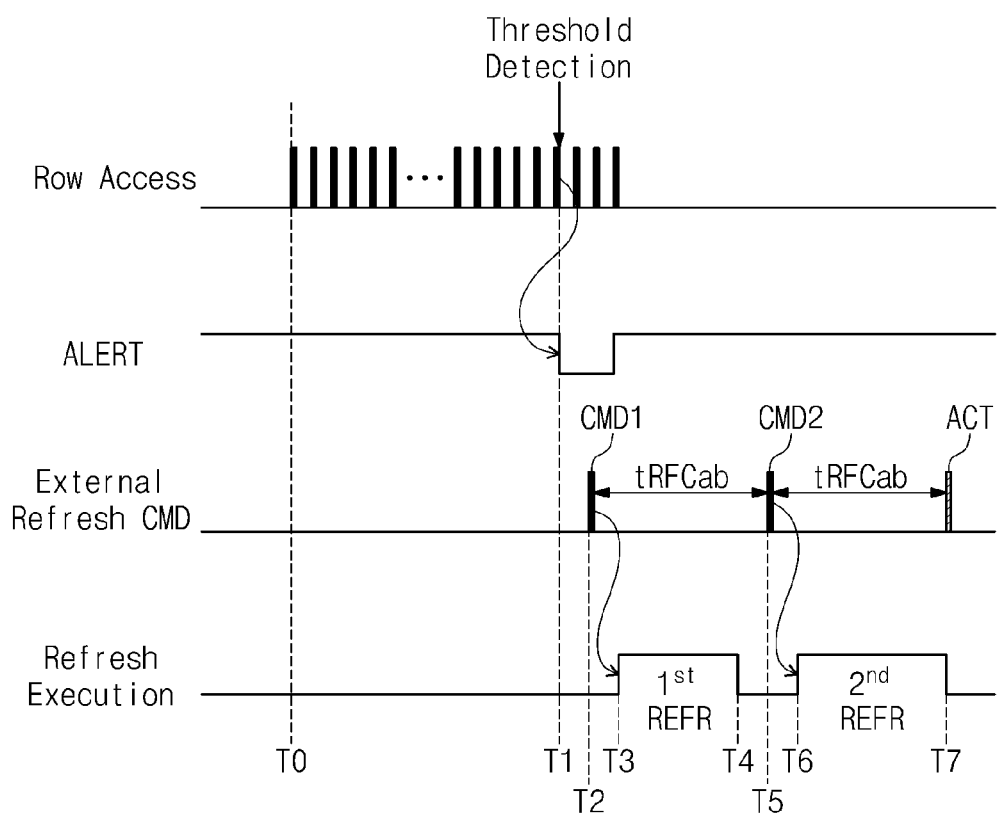
FIG. 7 is a timing diagram illustrating the refresh method of FIG. 6 according to the first embodiment.

FIG. 7 is a timing diagram illustrating the refresh method of FIG. 6 according to the first embodiment. Referring to FIG. 7, the volatile memory device 100 performs, for example, an all bank refresh operation through an external refresh command at the time of when the alert signal ALERT occurs.

A time T0 represents a time of when an operation for counting the number of dynamic disturbances DDN starts. The disturbance detector 180 of FIG. 3 starts an operation for counting the number of accesses on a specific memory area at the time T0. Exemplarily, it is assumed that the disturbance 180 counts the number of accesses on one row. The number of accesses on one row may be measured by counting the number of applying an active command ACT.

At a time T1, the number of dynamic disturbances DDN counted by the disturbance detector 180 reaches a threshold. The disturbance detector 180 generates a detect signal DET at the time T1. Also, the alert generator 190 of FIG. 3 outputs an alert signal ALERT. Here, the alert signal ALERT may be outputted as a pulse at which a logic 'Low' value is maintained for a predetermined period of time. Accordingly, when a pulse section elapses, the alert signal ALERT is again shifted into a logic 'high'. The alert signal ALERT may be outputted through an additional pin or may be outputted as status data to the outside. Through the alert signal ALERT, information that disturbance on a specific memory area reaches a threshold may be delivered to the outside of the volatile memory device 100.

At a time T2, the memory controller 200 of FIG. 2 provides a refresh command CMD1 in response to the alert signal ALERT. The refresh command CMD1 may be provided through control signals /CAS, /RAS, and /WE. Then, at a time T3, the refresh control logic 160 of the volatile memory device 100 performs a first refresh operation 1st REFR on a first word line exposed to disturbance. At a time T4, the first refresh operation 1st REFR is completed. For example, the first refresh operation 1st REFR may be a refresh operation on a respective first word line of all memory banks.

At a time T5, the memory controller 200 applies an additional refresh command CMD2 in consideration of a time consumed for an all bank refresh operation of the refresh command CMD1. Then, at a time T6, the refresh control logic 160 of the volatile memory device 100 performs a second refresh operation 2nd REFR on a second word line exposed to disturbance. The second refresh operation 2nd REFR is completed at a time T7. Here, the second refresh operation 2nd REFR may be a refresh operation on the respective second word line of all memory banks.

When two times of the refresh operation is completed in response to an external command of the volatile memory device 100, the following active command ACT or a precharge command may be provided. Furthermore, a count value of the number of dynamic disturbances DDN on a monitored specific memory area is reset. This operation is performed by the disturbance detector 180.

As mentioned above, when the number of disturbances counted with respect to a specific memory area reaches a threshold, the refresh method of the volatile memory device 100 to output an alert signal ALERT to the outside was described. Furthermore, the memory controller 200 provides two times of the refresh command to the volatile memory device 100 in response to the alert signal ALERT. The volatile memory device 100 performs a refresh operation on memory areas exposed to disturbance in response to the refresh commands CMD1 and CMD2 provided from the outside.

Figure 8:
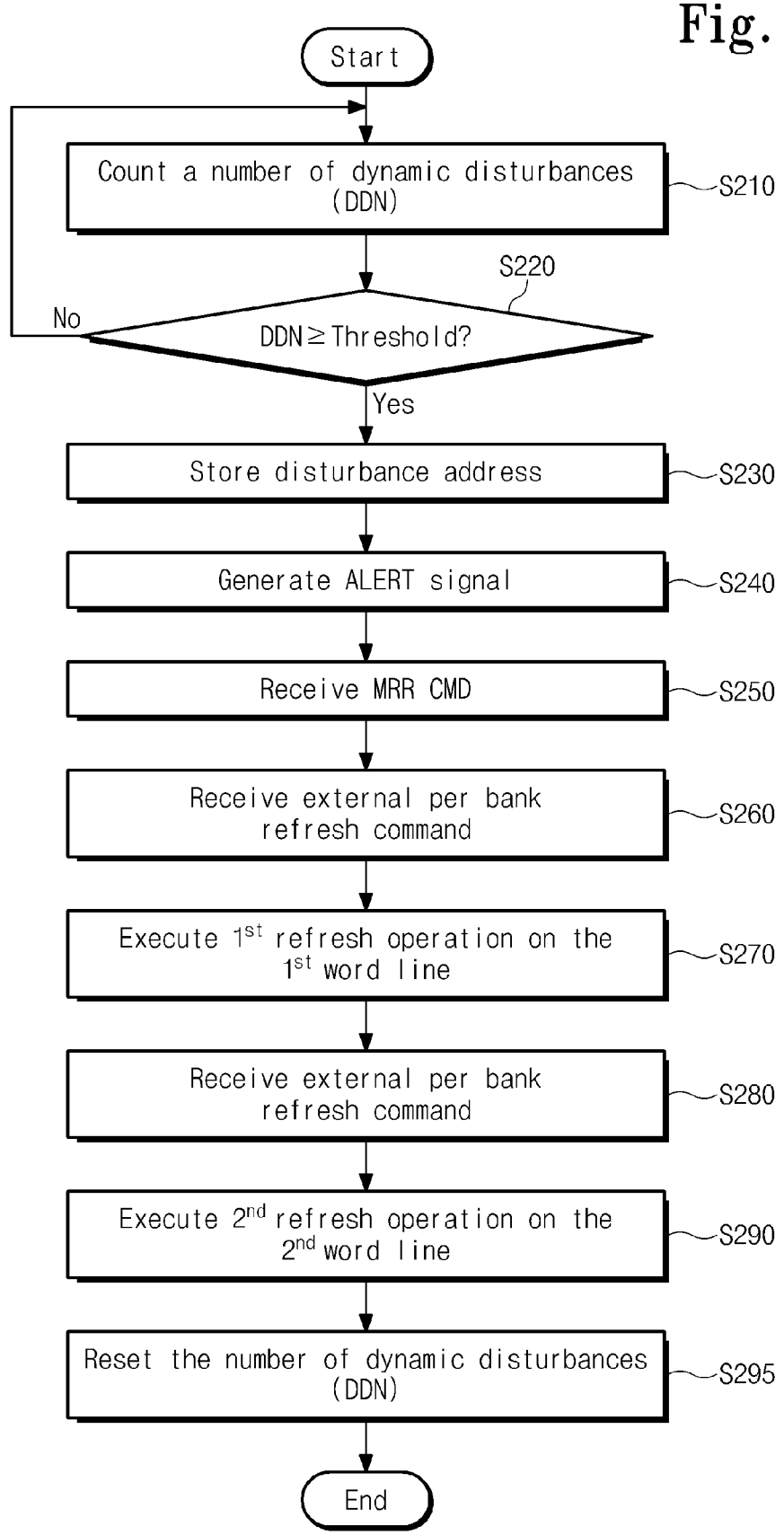
FIG. 8 is a flowchart illustrating a refresh method of a volatile memory device according to a second embodiment.

FIG. 8 is a flowchart illustrating a refresh method of a volatile memory device according to a second embodiment. Referring to FIG. 8, when it is determined that a number of disturbances on a specific memory area reaches a threshold, the volatile memory device 100 outputs an alert signal ALERT. For example, a per bank refresh operation capable of accessing a specific bank among refresh operations may be performed.

In operation S210, the volatile memory device 100 of FIG. 3 counts the number of dynamic disturbances DDN on a specific memory area. For example, the volatile memory device 100 may count a number of active commands on a specific memory area. Here, a unit for counting the number of active commands may be one word line. In one embodiment, a unit for counting the number of active commands may be a word line group unit including a plurality of word lines, a block unit, a bank unit, or a chip unit.

In operation S220, the volatile memory device 100 compares the number of counted dynamic disturbances DDN with a threshold. When the number of dynamic disturbances DDN is equal to or greater than a threshold within a predetermined time, it proceeds to operation S230. On the contrary, when the number of dynamic disturbances DDN is less than a threshold within a predetermined time, it proceeds to operation S210 for continuously monitoring the number of dynamic disturbances DDN.

In operation S230, an address of a memory area exposed to disturbance is stored in a register set. Also, an address stored in the disturbance address register 167 of FIG. 4 of the refresh control logic 160 is included. In one embodiment, an address stored in the register set may be outputted through a mode register read command MRR CMD later.

In operation S240, the alert generator 190 of FIG. 3 generates an alert signal ALERT in response to a detect signal DET from the disturbance detector 180. The alert generator 190 may output an alert signal ALERT, for example, in a pulse form to the outside of the volatile memory device 100. Here, an execution order of operation S230 and operation S240 may be performed simultaneously. In one embodiment, operation S240 may be performed first before operation S230.

In operation S250, the memory controller 200 provides a mode register read command MRR CMD to the volatile memory device 100 to issue, for example, a per bank refresh command. The volatile memory device 100 outputs address information on a memory area exposed to disturbance, which is stored in a mode register (e.g., a register set), to the outside in response to the mode register read command MRR CMD. Accordingly, an external access to a memory bank to be refreshed may be prevented by the memory controller 200.

In operation S260, the memory controller 200 provides, for example, a first per bank refresh command to the volatile memory device 100. The volatile memory device 100 receives the first per bank refresh command from the memory controller 200.

In operation S270, the volatile memory device 100 performs a first refresh operation on a first word line exposed to disturbance in a selected memory bank. For example, the volatile memory device 100 performs a refresh operation on the first word line of a selected memory bank.

In operation S280, the memory controller 200 provides a second bank refresh command to the volatile memory device 100. Then, the volatile memory device 100 receives the second per bank refresh command.

In operation S290, the volatile memory device 100 performs a second refresh operation on a second line exposed to disturbance. For example, the volatile memory device 100 performs a refresh operation on the second word line of a selected memory bank. Address information on the second word line may be provided by the disturbance address register 167. Here, the first word line and the second word line may be word lines adjacent to a word line where the number of accesses (or, the number of active commands) reaches a threshold.

In operation S295, a count value of the number of dynamic disturbances DDN on a memory area where data are rewritten through a refresh operation is reset.

The refresh method of the volatile memory device 100 to output an alert signal ALERT to the outside and receive a mode register read command and a refresh command from the outside was described above. At this point, the volatile memory device 100 may perform a refresh operation only on a selected memory bank.

Figure 9:
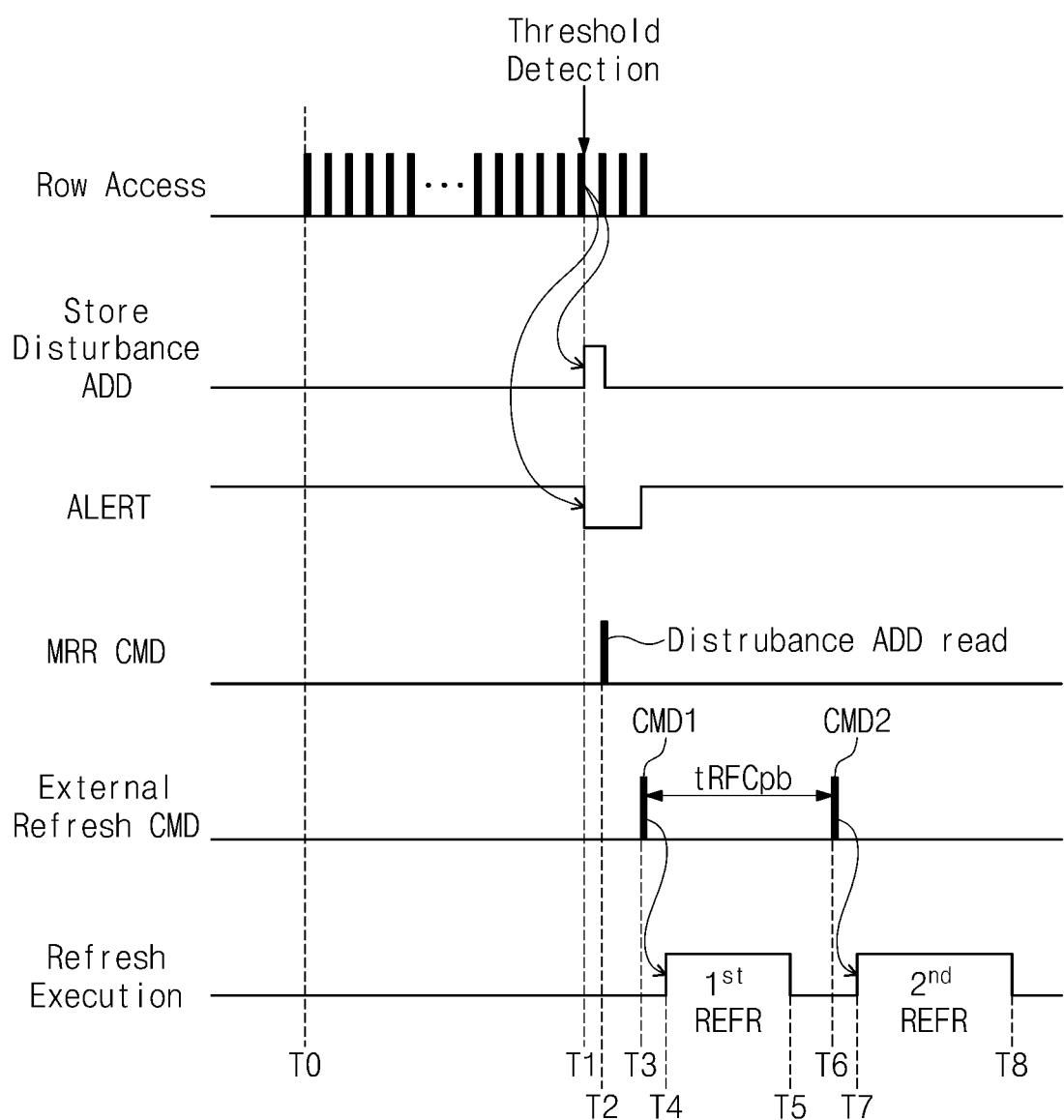
FIG. 9 is a timing diagram illustrating the refresh method of FIG. 8 according to the second embodiment.

FIG. 9 is a timing diagram illustrating the refresh method of FIG. 8 according to the second embodiment. Referring to FIG. 9, the volatile memory device 100 performs, for example, a per bank refresh operation in response to an external refresh command at the time of when an alert signal ALERT occurs.

A time T0 represents a time of when an operation for counting the number of dynamic disturbances DDN starts. The disturbance detector 180 of FIG. 3 starts an operation for counting the number of accesses on a specific memory area at the time T0. Exemplarily, it is assumed that the disturbance detector 180 counts the number of accesses on one row or word line. The number of accesses on one word line may be measured by counting the number of active commands for a specific period of time.

At a time T1, the number of dynamic disturbances DDN counted by the disturbance detector 180 reaches a threshold. The disturbance detector 180 generates a detect signal DET. Then, address information on a memory area exposed to disturbance (for example, a specific row) is stored in a register set. Additionally, the address information on a memory area exposed to disturbance is also stored in the disturbance address register 167 of FIG. 6 in the refresh control logic 160.

Also, the alert generator 190 of FIG. 3 outputs an alert signal ALERT at the time T1. Here, the alert signal ALERT may be outputted, for example, as a pulse at which a logic 'Low' value is maintained for a predetermined period of time. Accordingly, when a pulse period elapses, the alert signal ALERT is again shifted into a logic 'high'. The alert signal ALERT may be outputted through an additional pin or may be outputted as status data to the outside. Through the alert signal ALERT, information that disturbance on a specific memory area reaches a threshold may be delivered to the outside of the volatile memory device 100.

At a time T2, the memory controller 200 of FIG. 2 provides a mode register read command MRR CMD in response to the pulse of the alert signal ALERT. For example, address information on a memory area exposed to disturbance, which is stored in a register, may be provided to the memory controller 200. The memory controller 200 may freely access memory banks that are not to be refreshed.

At a time T3, the memory controller 200 provides a refresh command CMD1. The refresh command CMD1 may be provided through control signals /CAS, /RAS, and /WE. Then, at a time T4, the refresh control logic 160 of the volatile memory device 100 performs a first refresh operation 1st REFR on a first word line exposed to disturbance. The first refresh operation 1st REFR may be performed on only one bank stored in a register. The first refresh operation 1st REFR is completed at a time T5.

At a time T6, the memory controller 200 applies an additional refresh command CMD2 in consideration of a time tRFCpb consumed for a per bank refresh operation of the refresh command CMD1. Then, at a time T7, the refresh control logic 160 of the volatile memory device 100 performs a second refresh operation 2nd REFR on a second word line exposed to disturbance. The second refresh operation 2nd REFR is completed at a time T8.

When two times of the per bank refresh operation is completed in response to an external command of the volatile memory device 100, the following active command ACT or a pre-charge command may be provided. Furthermore, a count value of the number of dynamic disturbances DDN on a monitored specific memory area is reset.

As mentioned above, when the number of disturbances in a specific memory area reaches a threshold, a refresh method of the volatile memory device 100 to output an alert signal ALERT to the outside and receive a mode register read command MRR CMD and a refresh command was described.

Figure 10:
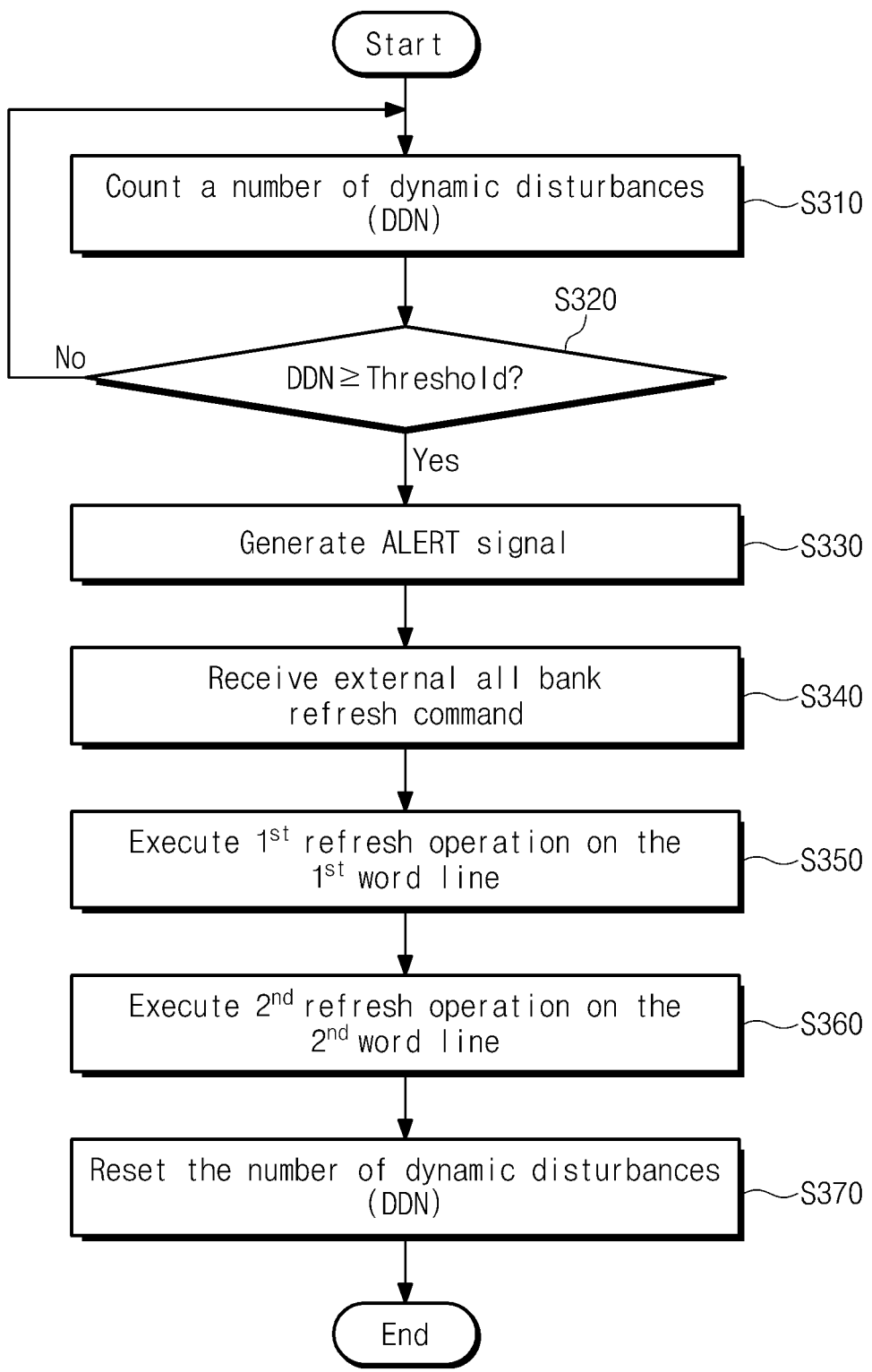
FIG. 10 is a flowchart illustrating a refresh method of a volatile memory device according to a third embodiment.

FIG. 10 is a flowchart illustrating a refresh method of a volatile memory device according to a third embodiment. Referring to FIG. 10, when it is determined that a number of disturbances on a specific memory area reaches a threshold, the volatile memory device 100 outputs an alert signal ALERT and receives a one-time refresh command.

In operation S310, the volatile memory device 100 of FIG. 3 counts the number of dynamic disturbances DDN on a specific memory area. For example, the volatile memory device 100 may count a number of active commands on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S320, the volatile memory device 100 compares the number of counted dynamic disturbances DDN with a threshold. When the number of dynamic disturbances DDN is equal to or greater than a threshold within a predetermined time, it proceeds to operation S330 for generating an alert signal ALERT. On the contrary, when the number of dynamic disturbances DDN is less than a threshold within a predetermined time, it proceeds to operation S310 for continuously monitoring the number of dynamic disturbances DDN.

In operation S330, the alert generator 190 of FIG. 3 generates an alert signal ALERT in response to a detect signal DET from the disturbance detector 180. The alert generator 190 may output an alert signal ALERT in a pulse form to the outside of the volatile memory device 100. However, an output system of the alert signal ALERT is not limited to this embodiment.

In operation S340, the memory controller 200 provides, for example, an all bank refresh command to the volatile memory device 100. The volatile memory device 100 receives the all bank refresh command from the memory controller 200 in response to the alert signal ALERT.

In operation S350, the volatile memory device 100 performs a first refresh operation on a first word line exposed to disturbance in response to the all bank refresh command. For example, the volatile memory device 100 performs a refresh operation on a respective first word line of all memory banks. Address information on the first word line may be provided by the disturbance address register 167 of FIG. 4.

In operation S360, the volatile memory device 100 performs a second refresh operation on a second line exposed to disturbance without receiving an additional refresh command. For example, the volatile memory device 100 performs a refresh operation on the respective second word line of all memory banks. Here, in order for the second refresh operation, the volatile memory device 100 may internally generate an all bank refresh command at the completion time of the first refresh operation.

In operation S370, a count value of the number of dynamic disturbances DDN on a memory area where data are rewritten through a refresh operation is reset.

The refresh method of the volatile memory device 100 to output an alert signal ALERT to the outside and receive a one-time all bank refresh command from the outside was described above. However, the volatile memory device 100 may perform two times of the refresh operation on an each word line exposed to disturbance.

Figure 11:
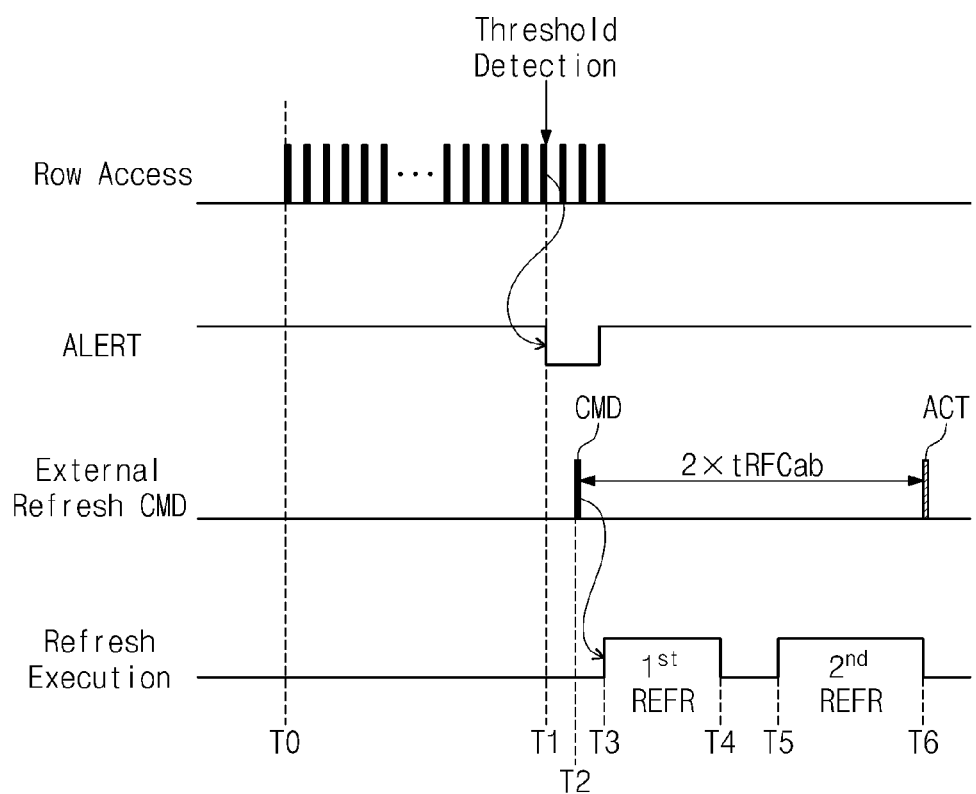
FIG. 11 is a timing diagram illustrating the refresh method of FIG. 10 according to the third embodiment.

FIG. 11 is a timing diagram illustrating the refresh method of FIG. 10 according to the third embodiment. Referring to FIG. 11, the volatile memory device 100 performs two times of all bank refresh operation at the time of when an alert signal ALERT is generated in response to one refresh command from the outside.

A time T0 represents a time of when an operation for counting the number of dynamic disturbances DDN starts. The disturbance detector 180 of FIG. 3 starts an operation for counting the number of accesses on a specific memory area at the time T0. Exemplarily, it is assumed that the disturbance detector 180 counts the number of accesses on one row. The number of accesses on one row may be measured by counting the number of applying an active command ACT.

At a time T1, the number of dynamic disturbances DDN counted by the disturbance detector 180 reaches a threshold. The disturbance detector 180 generates a detect signal DET. Here, the alert signal ALERT may be outputted as a pulse signal having a specific pulse width. The alert signal ALERT may be outputted through an additional equipped pin, or may be outputted as status data to the outside. Through the alert signal ALERT, information that disturbance on a specific memory area reaches a threshold may be delivered to the outside of the volatile memory device 100.

At a time T2, the memory controller 200 of FIG. 2 provides a refresh command CMD in response to an alert signal ALERT. In response to the one-time provided refresh command CMD, the refresh control logic 160 of the volatile memory device 100 performs a first refresh operation 1st REFR and a second refresh operation 2nd REFR. For example, at a time T3, the refresh control logic 160 performs the first refresh operation 1st REFR on a first word line exposed to disturbance. The first refresh operation 1st REFR is completed at a time T4. At the following time T5, the refresh control logic 160 performs a second refresh operation 2nd REFR on a second word line exposed to disturbance. The second refresh operation 2nd REFR is completed at a time T6.

When two times of the refresh operation is completed in response to an external command of the volatile memory device 100, the following active command ACT or a precharge command may be provided. Furthermore, a count value of the number of dynamic disturbances DDN on a monitored specific memory area is reset. Such an operation may be performed in the disturbance detector 180.

As mentioned above, when the number of disturbances counted with respect to a monitored memory area reaches a threshold, the refresh method of the volatile memory device 100 to output an alert signal ALERT to the outside was described. Furthermore, the memory controller 200 provides a one-time refresh command to the volatile memory device 100 in response to the alert signal ALERT. The volatile memory device 100 performs two times of the refresh operation in response to the one-time refresh command CMD.

Figure 12:
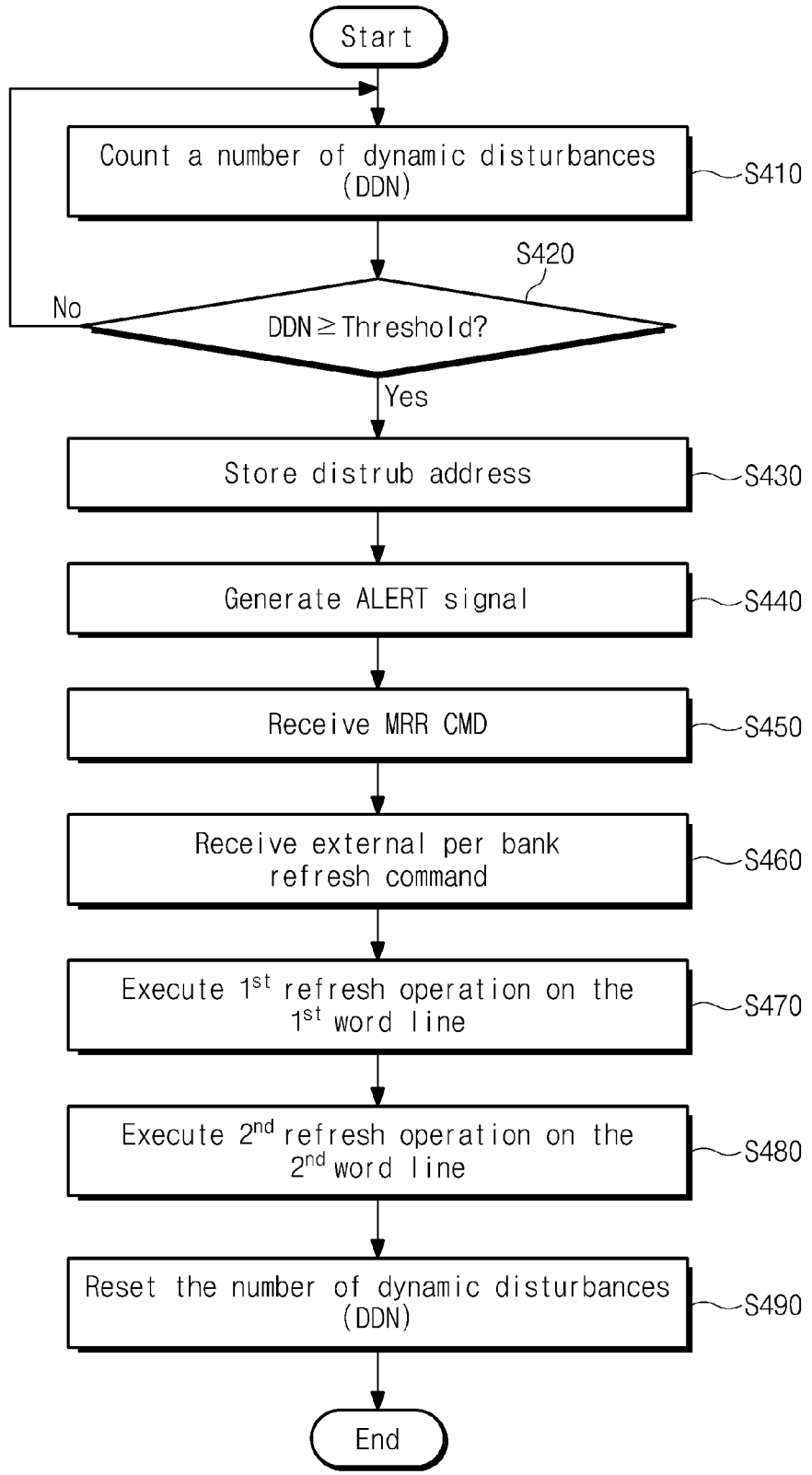
FIG. 12 is a flowchart illustrating a refresh method of a volatile memory device according to a fourth embodiment.

FIG. 12 is a flowchart illustrating a refresh method of a volatile memory device according to a fourth embodiment. Referring to FIG. 12, when it is determined that a number of disturbances on a specific memory area reaches a threshold, the volatile memory device 100 outputs an alert signal ALERT. For example, the volatile memory device 100 receives a one-time refresh command from the outside in order to perform two times of the per bank refresh operation.

In operation S410, the volatile memory device 100 of FIG. 3 counts a number of dynamic disturbances DDN on a specific memory area. For example, the volatile memory device 100 may count a number of active commands ACT on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S420, the volatile memory device 100 compares the number of counted dynamic disturbances DDN with a threshold. When the number of dynamic disturbances DDN is equal to or greater than a threshold within a predetermined period of time, it proceeds to operation S430. On the contrary, when the number of dynamic disturbances DDN is less than a threshold within a predetermined time, it proceeds to operation S410 for continuously monitoring the number of dynamic disturbances DDN.

In operation S430, an address (for example, a bank address) of a memory area exposed to disturbance is stored in a register set. Also, address information on a memory area exposed to disturbance may be stored in the disturbance address register 167 of FIG. 4 of the refresh control logic 160.

In operation S440, the alert generator 190 of FIG. 3 generates an alert signal ALERT in response to a detect signal DET from the disturbance detector 180. Here, an execution order of operation S430 and operation S440 may be performed simultaneously. In one embodiment, operation S440 may be performed first before operation S430.

In operation S450, the memory controller 200 provides a mode register read command MRR CMD to the volatile memory device 100 to issue a per bank refresh command. The volatile memory device 100 outputs address information on a memory area stored in a register set to the outside in response to the mode register read command MRR CMD. Accordingly, an external access to a memory bank that is to be refreshed being exposed to disturbance may be prevented by the memory controller 200.

In operation S460, the memory controller 200 provides a per bank refresh command to the volatile memory device 100. The volatile memory device 100 receives the per bank refresh command from the memory controller 200.

In operation S470, the volatile memory device 100 performs a first refresh operation on a first line exposed to disturbance in a selected memory bank. For example, the volatile memory device 100 performs a refresh operation on the first word line of a selected memory bank.

In operation S480, the volatile memory device 100 performs a second refresh operation on a second line exposed to disturbance. For example, the volatile memory device 100 performs a refresh operation on the second word line of a selected memory bank. Address information on the second word line may be provided by the disturbance address register 167. Here, the first word line and the second word line may be word lines adjacent to a word line where the number of accesses (or, the number of active commands) reaches a threshold.

In operation S490, a count value of the number of dynamic disturbances DDN on a memory area where data are rewritten through a refresh operation is reset.

The refresh method of the volatile memory device 100 to output an alert signal ALERT to the outside and receive a mode register read command and a refresh command from the outside was described above. At this point, the volatile memory device 100 may perform two times of the refresh operation in response to a one-time refresh command.

Figure 13:
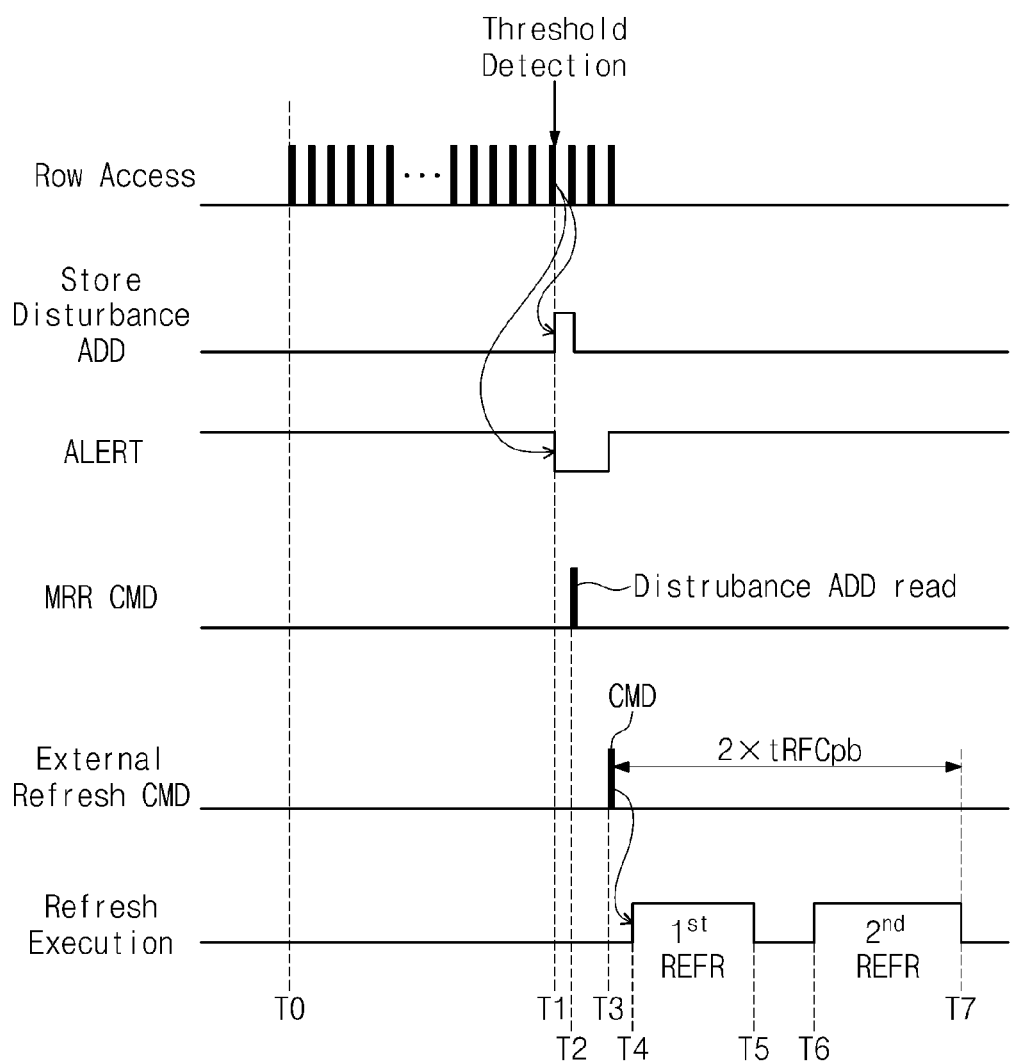
FIG. 13 is a timing diagram illustrating the refresh method of FIG. 12 according to the fourth embodiment.

FIG. 13 is a timing diagram illustrating the refresh method of FIG. 12 according to the fourth embodiment. Referring to FIG. 13, the volatile memory device 100 performs a per bank refresh operation in response to an external refresh command at the time of when an alert signal ALERT occurs.

A time T0 represents a time of when an operation for counting the number of dynamic disturbances DDN starts. The disturbance detector 180 of FIG. 3 starts an operation for counting the number of accesses on a specific memory area at the time T0. Exemplarily, it is assumed that the disturbance detector 180 counts the number of accesses on one row or word line. The number of accesses on one word line may be measured by counting the number of active commands for a specific period of time.

At a time T1, the number of dynamic disturbances DDN counted by the disturbance detector 180 reaches a threshold. The disturbance detector 180 generates a detect signal DET. Then, address information on a memory area exposed to disturbance (for example, a specific row) is stored in a register set. Additionally, the address information on a memory area exposed to disturbance is stored in a register. For example, address information on a memory area exposed to disturbance may be stored in the disturbance address register 167 of FIG. 6 in the refresh control logic 160.

Also, the alert generator 190 of FIG. 3 outputs an alert signal ALERT at the time T1. Here, the alert signal ALERT may be outputted as a pulse at which a logic 'Low' value is maintained for a predetermined section. Accordingly, when a pulse period elapses, the alert signal ALERT is again shifted into a logic 'high'. The alert signal ALERT may be outputted through an additional pin or may be outputted as status data to the outside. Through the alert signal ALERT, information that disturbance on a specific memory area reaches a threshold may be delivered to the outside of the volatile memory device 100.

At a time T2, the memory controller 200 of FIG. 2 provides a mode register read command MRR CMD in response to the alert signal ALERT. Then, address information on a memory area exposed to disturbance, which is stored in a register, may be provided to the memory controller 200. The memory controller 200 may freely access memory banks that are not to be refreshed.

At a time T3, the memory controller 200 provides a refresh command CMD. The refresh command CMD may be provided through control signals /CAS, /RAS, and /WE. Then, at a time T4, the refresh control logic 160 of the volatile memory device 100 performs a first refresh operation 1st REFR on a first word line exposed to disturbance. The first refresh operation 1st REFR may be performed on only one bank stored in a register. The first refresh operation 1st REFR is completed at a time T5.

At a time T6, the refresh control logic 160 of the volatile memory device 100 performs a second refresh operation 2nd REFR on a second word line exposed to disturbance. The second refresh operation 2nd REFR is completed at a time T7.

When two times of the per bank refresh operation is completed in response to an external command of the volatile memory device 100, the following active command ACT or a pre-charge command may be provided. Furthermore, a count value of the number of dynamic disturbances DDN on a monitored specific memory area is reset.

As mentioned above, when the number of disturbances counted with respect to a monitored memory area reaches a threshold, the refresh method of the volatile memory device 100 to output an alert signal ALERT to the outside and receive a refresh command was described. When the memory controller 200 provides a one-time per bank refresh command from the outside, the volatile memory device 100 performs two times of the per bank refresh operation.

Figure 14:
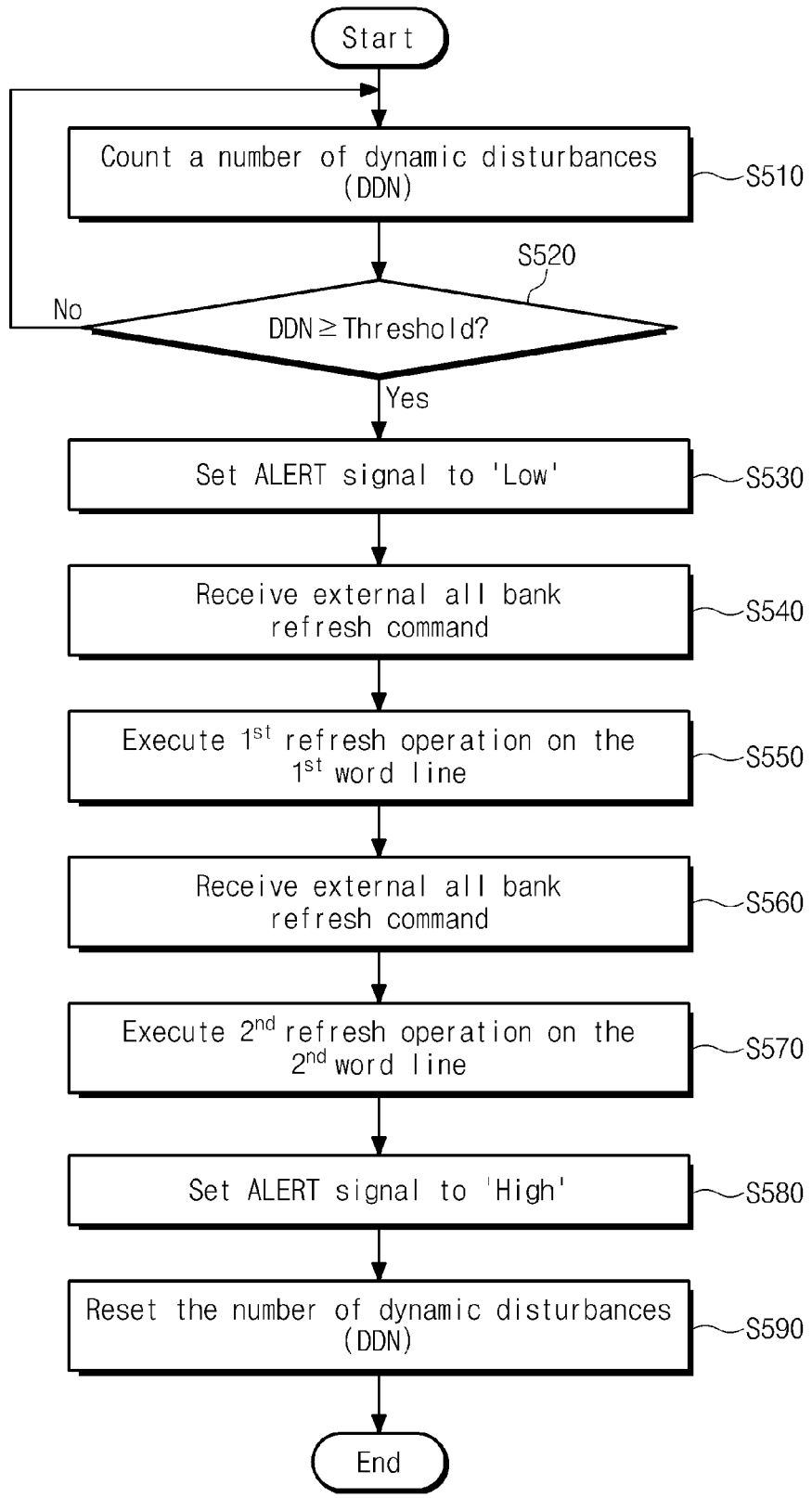
FIG. 14 is a flowchart illustrating a refresh method of a volatile memory device according to a fifth embodiment.

FIG. 14 is a flowchart illustrating a refresh method of a volatile memory device according to a fifth embodiment. Referring to FIG. 14, when it is determined that a number of disturbances on a specific memory area reaches a threshold, the volatile memory device 100 shifts an alert signal ALERT from a logic 'High' into a logic 'Low'. For example, when a refresh operation on a memory area exposed to disturbance is completed in response to a command from the outside, the volatile memory device 100 shifts an alert signal ALERT from a logic 'High' into a logic 'Low'.

In operation S510, the volatile memory device 100 of FIG. 3 counts the number of dynamic disturbances DDN on a specific memory area. For example, the volatile memory device 100 may count a number of active commands ACT on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S520, the volatile memory device 100 compares the number of counted dynamic disturbances DDN with a threshold. When the number of dynamic disturbances DDN is equal to or greater than a threshold within a predetermined time, it proceeds to operation S530. On the contrary, when the number of dynamic disturbances DDN is less than a threshold within a predetermined time, it proceeds to operation S510 for continuously monitoring the number of dynamic disturbances DDN.

In operation S530, the alert generator 190 of FIG. 3 shifts an alert signal ALERT from a logic 'High' into a logic 'Low' in response to a detect signal DET from the disturbance detector 180. The alert signal generator 190 may output the alert signal ALERT to the outside of the volatile memory device 100 through an additional pin.

In operation S540, the memory controller 200 provides a first all bank refresh command to the volatile memory device 100. The volatile memory device 100 receives the first all bank refresh command provided from the memory controller 200 of FIG. 2.

In operation S550, the volatile memory device 100 performs a first refresh operation on a first word line exposed to disturbance. For example, the volatile memory device 100 may perform a refresh operation on a respective first word line of all memory banks. Address information on the first word line may be provided by the disturbance address register 167 of FIG. 4.

In operation S560, the memory controller 200 provides a second all bank refresh command to the volatile memory device 100. For example, the volatile memory device 100 receives the second all bank refresh command.

In operation S570, the volatile memory device 100 performs a second refresh operation on a second word line exposed to disturbance. For example, the volatile memory device 100 may perform a refresh operation on a respective second word line of all memory banks. Address information on the second word line may be provided by the disturbance address register 167. For example, the first word line and the second word line may be word lines adjacent to a word line where the number of accesses (or, the number of active commands) exceeds a threshold.

In operation S580, the alert generator 190 of FIG. 3 shifts a level of the alert signal ALERT from a logic 'Low' to a logic 'High'.

In operation S590, the number of dynamic disturbances DDN on a memory area where data are rewritten through a refresh operation may be reset.

As mentioned above, when the number of disturbances reaches a threshold, the volatile memory device 100 outputs an alert signal ALERT that is shifted into a logic 'Low' when the number of disturbances reaches a threshold and is shifted into a logic 'High' when a refresh operation on a memory area exposed to disturbance is completed. Accordingly, it is possible to realize the volatile memory device 100 providing various status information to the outside through an alert signal ALERT.

Figure 15:
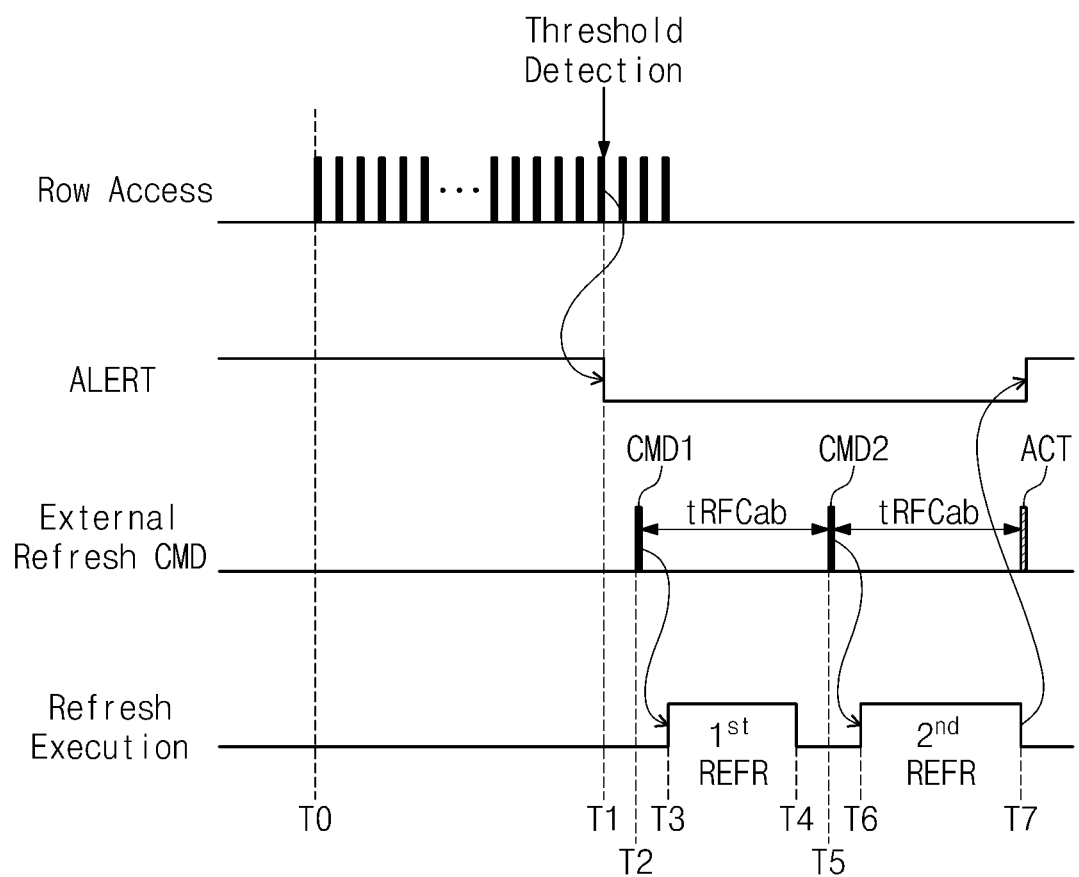
FIG. 15 is a timing diagram illustrating the refresh method of FIG. 14 according to the fifth embodiment.

FIG. 15 is a timing diagram illustrating the refresh method of FIG. 14 according to the fifth embodiment. Referring to FIG. 15, the volatile memory device 100 outputs an alert signal ALERT as a logic 'Low' level and performs an all bank refresh operation through an external refresh command. Then, once the all bank refresh operation is completed, the volatile memory device 100 shifts the alert signal ALERT into a logic 'High'.

A time T0 represents a time of when an operation for counting the number of dynamic disturbances DDN starts. The disturbance detector 180 of FIG. 3 starts an operation for counting the number of accesses on a specific memory area at the time T0.

At a time T1, the number of dynamic disturbances DDN counted by the disturbance detector 180 reaches a threshold. Then, the alert generator 190 of FIG. 3 outputs an alert signal ALERT as a logic 'Low' level.

At a time T2, the memory controller 200 of FIG. 2 provides an all bank refresh command CMD1 in response the logic 'Low' shift of the alert signal ALERT.

At a time T3, the refresh control logic 160 of the volatile memory device 100 performs a first refresh operation 1st REFR on a first word line exposed to disturbance. The first refresh operation 1st REFR is completed at a time T4. Here, the first refresh operation 1st REFR may be a refresh operation on a respective first word line of all memory banks.

At a time T5, the memory controller 200 applies an additional refresh command CMD2 in consideration of a time tRFCab consumed for an all bank refresh operation of the refresh command CMD 1. Then, at a time T6, the refresh control logic 160 of the volatile memory device 100 performs a second refresh operation 2nd REFR on a second word line exposed to disturbance. The second refresh operation 2nd REFR is completed at a time T7. Here, the second refresh operation 2nd REFR may be a refresh operation on a respective second word line of all memory banks.

At a time T7 of when a refresh operation on a memory area exposed to disturbance is completed, the alert generator 190 of FIG. 3 shifts the alert signal ALERT into a logic 'High' level. Once two times of the refresh operation is completed through an external command of the volatile memory device 100, the following active command ACT or a pre-charge command may be provided. Furthermore, a count value of the number of dynamic disturbances DDN on a monitored specific memory area is reset. This operation is performed by the disturbance detector 180.

As mentioned above, when the number of disturbances counted with respect to a monitored memory area reaches a threshold, a refresh method of the volatile memory device 100 to shift a level of an alert signal ALERT outputted to the outside was described. However, a logic 'Low' section and a logic 'High' section of the alert signal are interchangeable.

Figure 16:
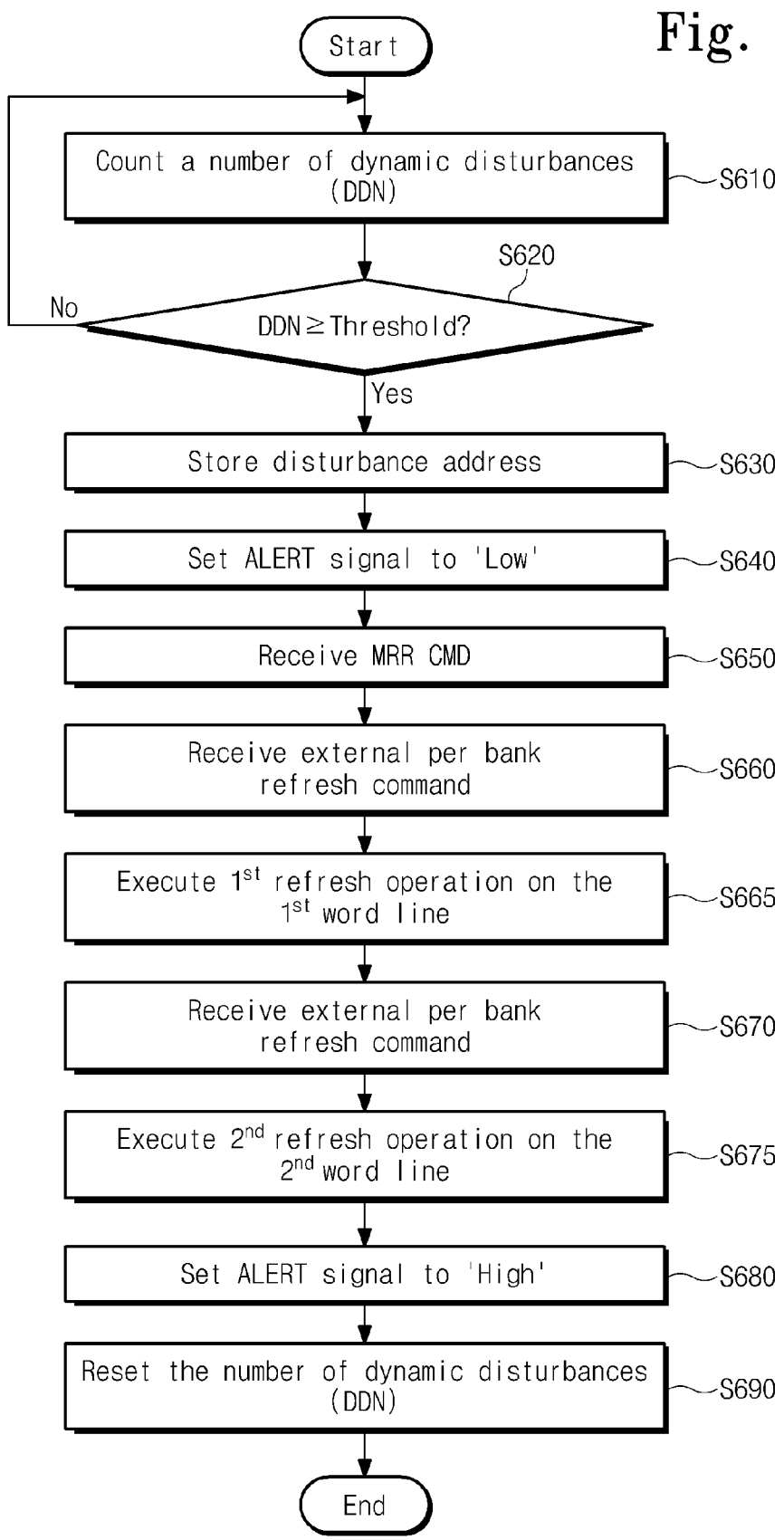
FIG. 16 is a flowchart illustrating a refresh method of a volatile memory device according to a sixth embodiment.

FIG. 16 is a flowchart illustrating a refresh method of a volatile memory device according to a sixth embodiment. Referring to FIG. 16, when it is determined that a number of disturbances on a specific memory area reaches a threshold, the volatile memory device 100 outputs an alert signal ALERT. For example, a per bank refresh operation in which an access to a specific bank is possible from the outside is performed.

In operation S610, the volatile memory device 100 of FIG. 3 counts the number of dynamic disturbances DDN on a specific memory area. For example, the volatile memory device 100 may count the number of active commands on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S620, the volatile memory device 100 compares the number of counted dynamic disturbances DDN with a threshold. When the number of dynamic disturbances DDN is equal to or greater than a threshold within a predetermined time, it proceeds to operation S630. On the contrary, when the number of dynamic disturbances DDN is less than a threshold within a predetermined time, it proceeds to operation S610 for continuously monitoring the number of dynamic disturbances DDN.

In operation S630, an address of a memory area exposed to disturbance is stored in a specific register. Also, an address stored in the disturbance address register 167 of FIG. 4 of the refresh control logic 160 is included.

In operation S640, the alert generator 190 of FIG. 3 outputs an alert signal ALERT as a logic 'Low' in response to a detect signal DET from the disturbance detector 180. In one embodiment, an execution order of operation S630 and operation S640 may be interchangeable. In one embodiment, operation S630 and operation S640 may be performed simultaneously.

In operation S650, the memory controller 200 provides a mode register read command MRR CMD to the volatile memory device 100 to issue a per bank refresh command. The volatile memory device 100 outputs status data stored in a mode register to the outside in response to the mode register read command MRR CMD. Accordingly, an external access to a memory bank that is to be detected and refreshed may be prevented by the memory controller 200.

In operation S660, the memory controller 200 provides a first per bank refresh command to the volatile memory device 100. The volatile memory device 100 receives the first per bank refresh command from the memory controller 200.

In operation S665, the volatile memory device 100 performs a first refresh operation on a first line receiving disturbance in the selected memory bank. For example, the volatile memory device 100 performs a refresh operation on the first word line of the selected memory bank.

In operation S670, the memory controller 200 provides a second per bank refresh command to the volatile memory device 100. Then, the volatile memory device 100 receives the second per bank refresh command from the memory controller 200.

In operation S675, the volatile memory device 100 performs a second refresh operation on a second word line of all memory banks. For example, the volatile memory device 100 performs a refresh operation on a respective second word line of the all memory banks. Address information on the second word line may be provided by the disturbance address register 167. For example, the first word line and the second word line may be word lines adjacent to a word line where the number of accesses (or, the number of active commands) exceeds a threshold.

In operation S680, the alert generator 190 of FIG. 3 shifts a level of the alert signal ALERT to a logic 'High'.

In operation S690, the number of dynamic disturbances DDN on a memory area where data are rewritten through a refresh operation may be reset.

As mentioned above, characteristics of the volatile memory device 100 such as whether a specific memory area is exposed to disturbance is determined through an alert signal ALERT and whether a refresh operation is completed according thereto is outputted to the outside were described.

Figure 17:
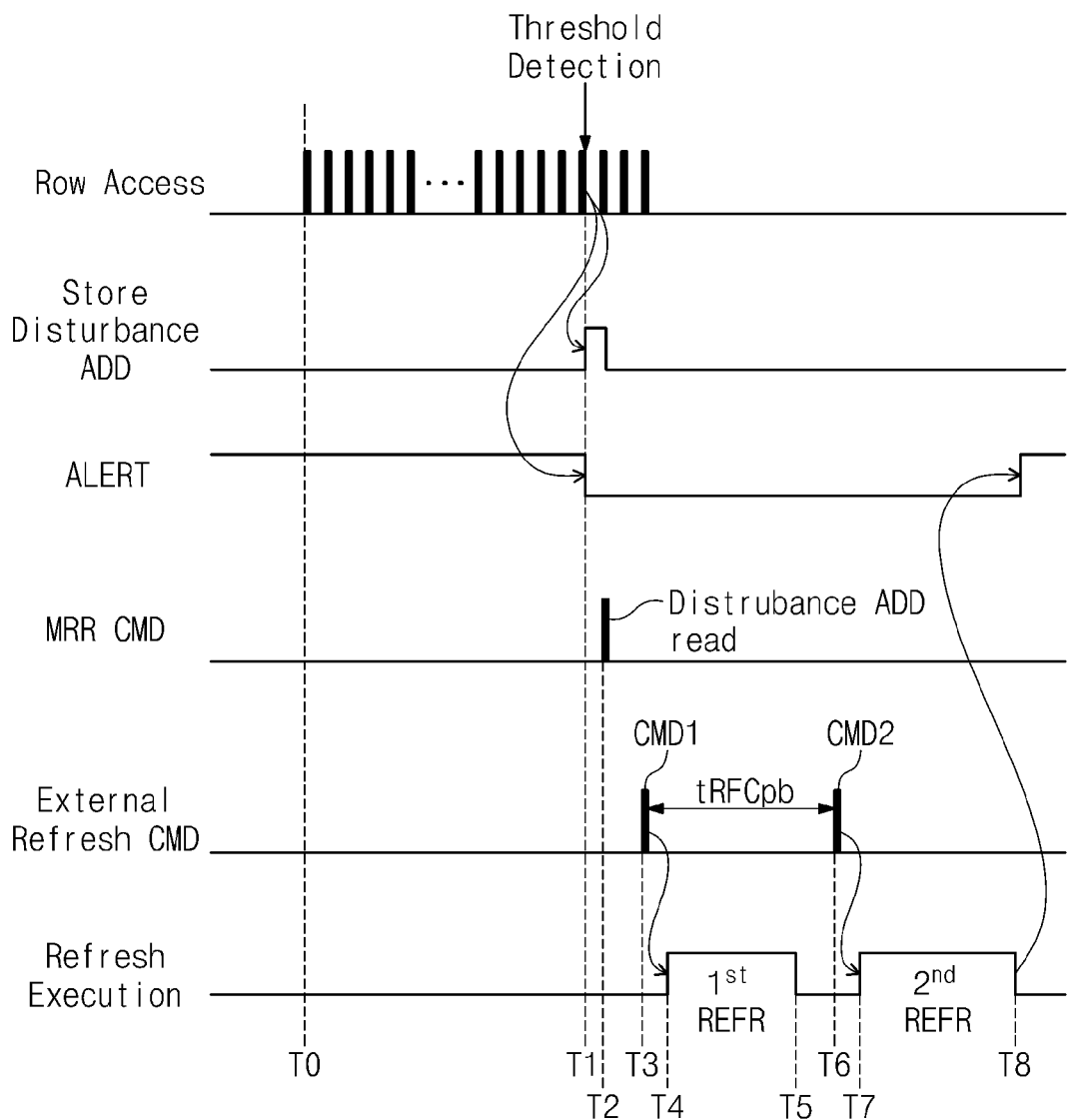
FIG. 17 is a timing diagram illustrating the refresh method of FIG. 16 according to the sixth embodiment.

FIG. 17 is a timing diagram illustrating the refresh method of FIG. 16 according to the sixth embodiment. Referring to FIG. 17, the volatile memory device 100 performs a per bank refresh operation in response to an external refresh command in a logic 'Low' section of an alert signal ALERT.

A time T0 represents a time of when an operation for counting the number of dynamic disturbances DDN starts. The disturbance detector 180 of FIG. 3 starts an operation for counting the number of accesses on a specific memory area at the time T0. It is assumed that the number of accesses to a specific memory area such as one row or word line is counted. For example, the number of accesses to one word line may be measured by counting the number of active commands for a specific period of time.

At a time T1, the number of dynamic disturbances DDN counted by the disturbance detector 180 reaches a threshold. The disturbance detector 180 generates a detect signal DET. Then, address information on a memory area exposed to disturbance (for example, a specific row) is stored in a register. For example, the address information on a memory area exposed to disturbance is also stored in the disturbance address register 167 of FIG. 6 in the refresh control logic 160. Moreover, the address information on a memory area exposed to disturbance may be stored in an additional register set.

Furthermore, at the time T1, the alert generator 190 of FIG. 3 shifts the alert signal ALERT from a logic 'High' to a logic 'Low'. Accordingly, the alert signal ALERT may be outputted through an additional pin or may be outputted as status data to the outside. Information that disturbance on a specific memory area reaches a threshold may be delivered to the outside of the volatile memory device 100.

At a time T2, the memory controller 200 of FIG. 2 provides a mode register read command MRR CMD in response to the alert signal ALERT. Then, address information on a memory area exposed to disturbance, which is stored in a register set, may be provided to the memory controller 200. The memory controller 200 may freely access memory banks that are not to be refreshed.

At a time T3, the memory controller 200 provides a refresh command CMD1. Then, at a time T4, the refresh control logic 160 of the volatile memory device 100 performs a first refresh operation 1st REFR on a first word line exposed to disturbance. The first refresh operation 1st REFR is performed on only one bank stored in a register. The first refresh operation 1st REFR is completed at a time T5.

At a time T6, the memory controller 200 applies an additional refresh command CMD2 in consideration of a time consumed for a per bank refresh operation of the refresh command CMD1 . Then, at a time T7, the refresh control logic 160 of the volatile memory device 100 performs a second refresh operation 2nd REFR on a second word line exposed to disturbance in a selected memory bank. The second refresh operation 2nd REFR is completed at a time T7.

When the second refresh operation 2nd REFR is completed, the alert generator 190 shifts an alert signal ALERT from a logic 'High' to a logic 'Low' according to a status of the refresh control logic 160.

When two times of the per bank refresh operation is completed in response to an external command of the volatile memory device 100, the following active command ACT or a pre-charge command may be provided. Furthermore, a count value of the number of dynamic disturbances DDN on a monitored specific memory area is reset.

According to the above-mentioned sixth embodiment, the alert signal ALERT may include information on whether a monitored memory area is exposed to disturbance and whether to perform a refresh operation.

Figure 18:
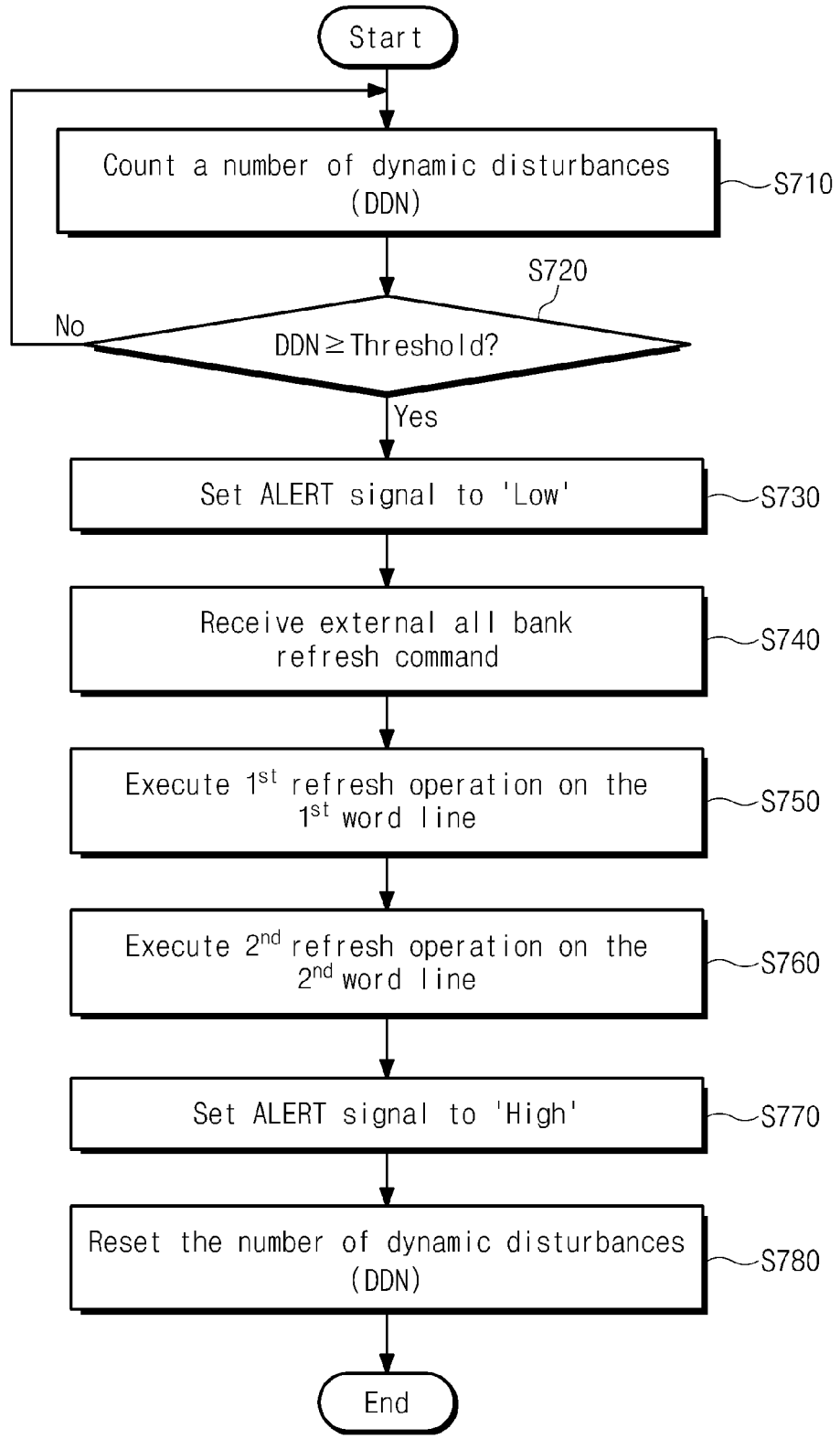
FIG. 18 is a flowchart illustrating a refresh method of a volatile memory device according to a seventh embodiment.

FIG. 18 is a flowchart illustrating a refresh method of a volatile memory device according to a seventh embodiment. Referring to FIG. 18, when it is determined that a number of disturbances on a specific memory area reaches a threshold, the volatile memory device 100 changes a level of an alert signal ALERT and receives a one-time refresh command.

In operation S710, the volatile memory device 100 of FIG. 3 counts the number of dynamic disturbances DDN on a specific memory area. For example, the volatile memory device 100 may count a number of active commands on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S720, the volatile memory device 100 compares the number of counted dynamic disturbances DDN with a threshold. When the number of dynamic disturbances DDN is equal to or greater than a threshold within a predetermined time, it proceeds to operation S730. On the contrary, when the number of dynamic disturbances DDN is less than a threshold within a predetermined time, it proceeds to operation S710 for continuously monitoring the number of dynamic disturbances DDN.

In operation S730, the alert generator 190 of FIG. 3 shifts an alert signal ALERT into a logic 'Low' in response to a detect signal DET from the disturbance detector 180. The alert generator 190 may output an alert signal ALERT to the outside of the volatile memory device 100 through an additional pin. However, an output system of the alert signal ALERT is not limited to this embodiment.

In operation S740, the memory controller 200 of FIG. 2 provides an all bank refresh command to the volatile memory device 100. The volatile memory device 100 receives the all bank refresh command from the memory controller 200 in response to an alert signal ALERT.

In operation S750, the volatile memory device 100 performs a first refresh operation on a first word line exposed to disturbance in response to an all bank refresh command. For example, the volatile memory device 100 performs a refresh operation on a respective first word line of all memory banks. Address information on a first word line may be provided by the disturbance address register 167 of FIG. 4.

In operation S760, the volatile memory device 100 performs a second refresh operation on a second line exposed to disturbance without receiving an additional refresh command. That is, the volatile memory device 100 performs a refresh operation on a respective second word line of all memory banks. In one embodiment, in order for the second refresh operation, the volatile memory device 100 may internally generate an all bank refresh command at the completion time of the first refresh operation.

In operation S770, the alert generator 190 shifts an alert signal ALERT to a logic 'High' when the second refresh operation is completed by the refresh control logic 160.

In operation S780, a count value of the number of dynamic disturbances DDN on a memory area where data are rewritten through a refresh operation is reset.

The refresh method of the volatile memory device 100 to output an alert signal ALERT to the outside and receive a one-time all bank refresh command from the outside was described above. However, the volatile memory device 100 may perform two times of the refresh operation on an each word line exposed to disturbance. Here, the alert signal ALERT includes information on whether disturbance occurs and whether a refresh operation on a memory area exposed to disturbance is completed.

Figure 19:
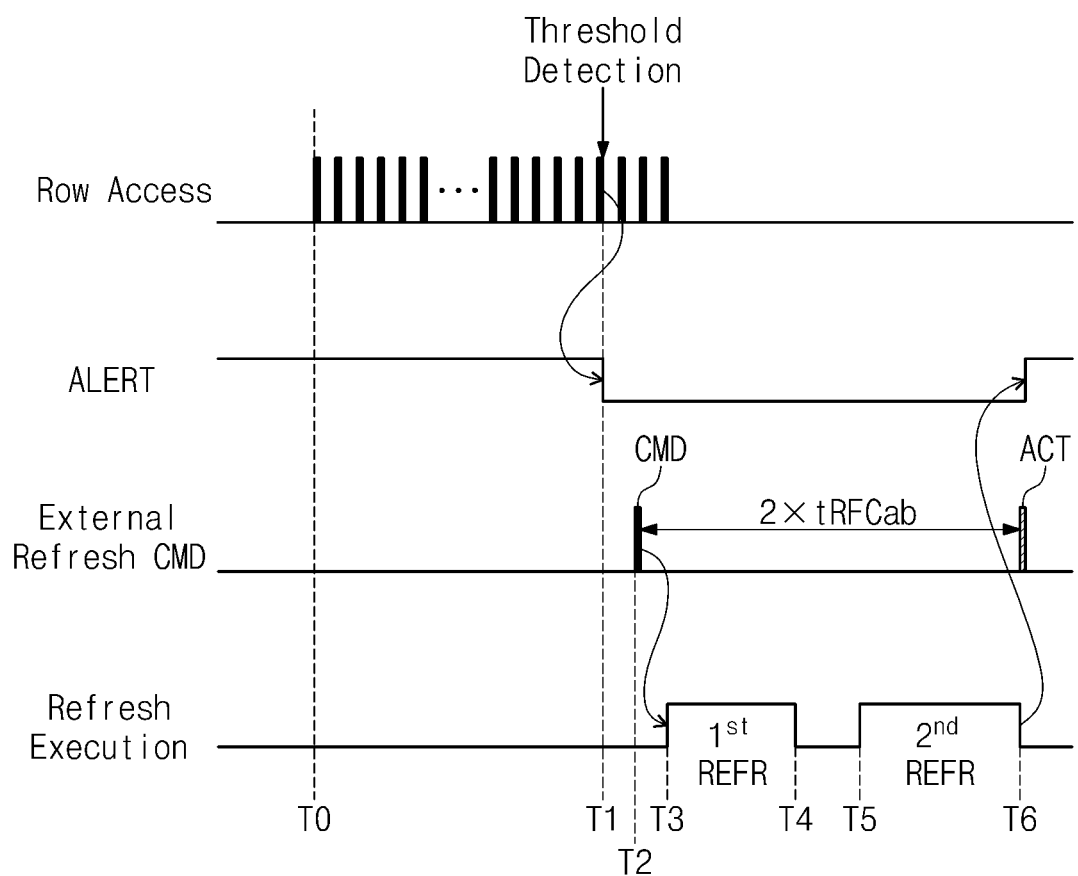
FIG. 19 is a timing diagram illustrating the refresh method of FIG. 18 according to the seventh embodiment.

FIG. 19 is a timing diagram illustrating the refresh method of FIG. 18 according to the seventh embodiment. Referring to FIG. 19, the volatile memory device 100 performs two times of the all bank refresh operation at the time of when an alert signal ALERT is generated in response to one refresh command from the outside.

A time T0 represents a time of when an operation for counting the number of dynamic disturbances DDN starts. The disturbance detector 180 of FIG. 3 starts an operation for counting the number of accesses on a specific memory area at the time T0. Exemplarily, it is assumed that the disturbance detector 180 counts the number of accesses on one row. The number of accesses on one row may be measured by counting the number of applying an active command ACT.

At a time T1, the number of dynamic disturbances DDN counted by the disturbance detector 180 reaches a threshold. The disturbance detector 180 generates a detect signal DET. Also, the alert generator 190 of FIG. 3 shifts an alert signal ALERT into a logic 'Low' level in response to the detect signal DET.

At a time T2, the memory controller 200 of FIG. 2 provides a refresh command CMD in response to the shift of the alert signal ALERT. In response to the one-time provided refresh command CMD, the refresh control logic 160 of the volatile memory device 100 performs a first refresh operation 1st REFR and a second refresh operation 2nd REFR. For example, at a time T3, the refresh control logic 160 performs the first refresh operation 1st REFR on a first word line exposed to disturbance. The first refresh operation 1st REFR is completed at a time T4. At the following time T5, the refresh control logic 160 performs a second refresh operation 2nd REFR on a second word line exposed to disturbance. The second refresh operation 2nd REFR is completed at a time T6.

When two times of the refresh operation is completed in the volatile memory device 100, a level of the alert signal ALERT is shifted into a logic 'High' level at a time T6. Then, the following active command ACT or a pre-charge command may be provided. Furthermore, a count value of the number of dynamic disturbances DDN on a monitored specific memory area is reset. Such an operation may be performed in the disturbance detector 180.

Figure 20:
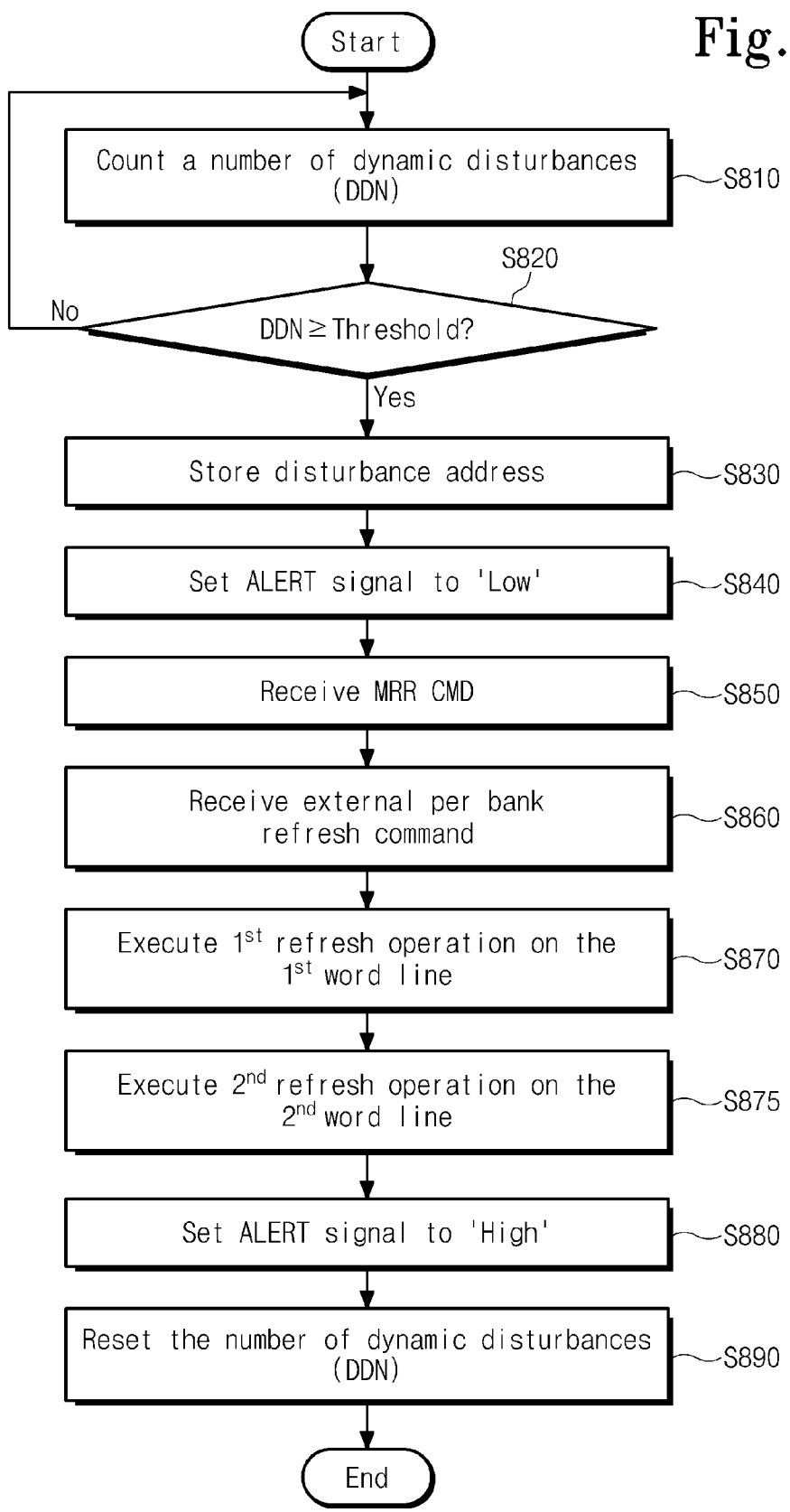
FIG. 20 is a flowchart illustrating a refresh method of a volatile memory device according to an eighth embodiment.

FIG. 20 is a flowchart illustrating a refresh method of a volatile memory device according to an eighth embodiment. Referring to FIG. 20, when it is determined that a number of disturbances on a specific memory area reaches a threshold, the volatile memory device 100 outputs an alert signal ALERT. Then, the volatile memory device 100 receives a one-time refresh command from the outside in order to perform two times of the per bank refresh operation.

In operation S810, the volatile memory device 100 of FIG. 3 counts the number of dynamic disturbances DDN on a specific memory area. For example, the volatile memory device 100 may count a number of active commands ACT on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S820, the volatile memory device 100 compares the number of counted dynamic disturbances DDN with a threshold. When the number of dynamic disturbances DDN is equal to or greater than a threshold within a predetermined time, it proceeds to operation S830. On the contrary, when the number of dynamic disturbances DDN is less than a threshold within a predetermined time, it proceeds to operation S810 for continuously monitoring the number of dynamic disturbances DDN.

In operation S830, an address (for example, a bank address) of a memory area exposed to disturbance is stored in a specific register set. Of course, an address stored in the disturbance address register 167 of FIG. 6 of the refresh control logic 160 may be included.

In operation S840, the alert generator 190 of FIG. 3 shifts an alert signal ALERT into a logic 'Low' in response to a detect signal DET from the disturbance detector 180. For example, an execution order of operation S830 and operation S840 may be interchangeable.

In operation S850, the memory controller 200 provides a mode register read command MRR CMD to the volatile memory device 100 to issue a per bank refresh command. The volatile memory device 100 outputs address information on a memory area stored in a register set to the outside in response to the mode register read command MRR CMD. Accordingly, an external access to a memory bank that is to be refreshed being exposed to disturbance may be prevented by the memory controller 200.

In operation S860, the memory controller 200 provides a per bank refresh command to the volatile memory device 100. The volatile memory device 100 receives the per bank refresh command from the memory controller 200.

In operation S870, the volatile memory device 100 performs a first refresh operation on a first line exposed to disturbance in a selected memory bank. For example, the volatile memory device 100 performs a refresh operation on the first word line of a selected memory bank.

In operation S880, the volatile memory device 100 performs a second refresh operation on a second line exposed to disturbance. That is, the volatile memory device 100 performs a refresh operation on the second word line of a selected memory bank. Address information on the second word line may be provided by the disturbance address register 167. For example, the first word line and the second word line may be word lines adjacent to a word line where the number of accesses (or, the number of active commands) reaches a threshold.

In operation S890, a count value of the number of dynamic disturbances DDN on a memory area where data are rewritten through a refresh operation is reset.

The refresh method of the volatile memory device 100 to output an alert signal ALERT to the outside and receive a mode register read command and a refresh command from the outside was described above. At this point, the volatile memory device 100 may perform two times of the refresh operation in response to a one-time refresh command.

Figure 21:
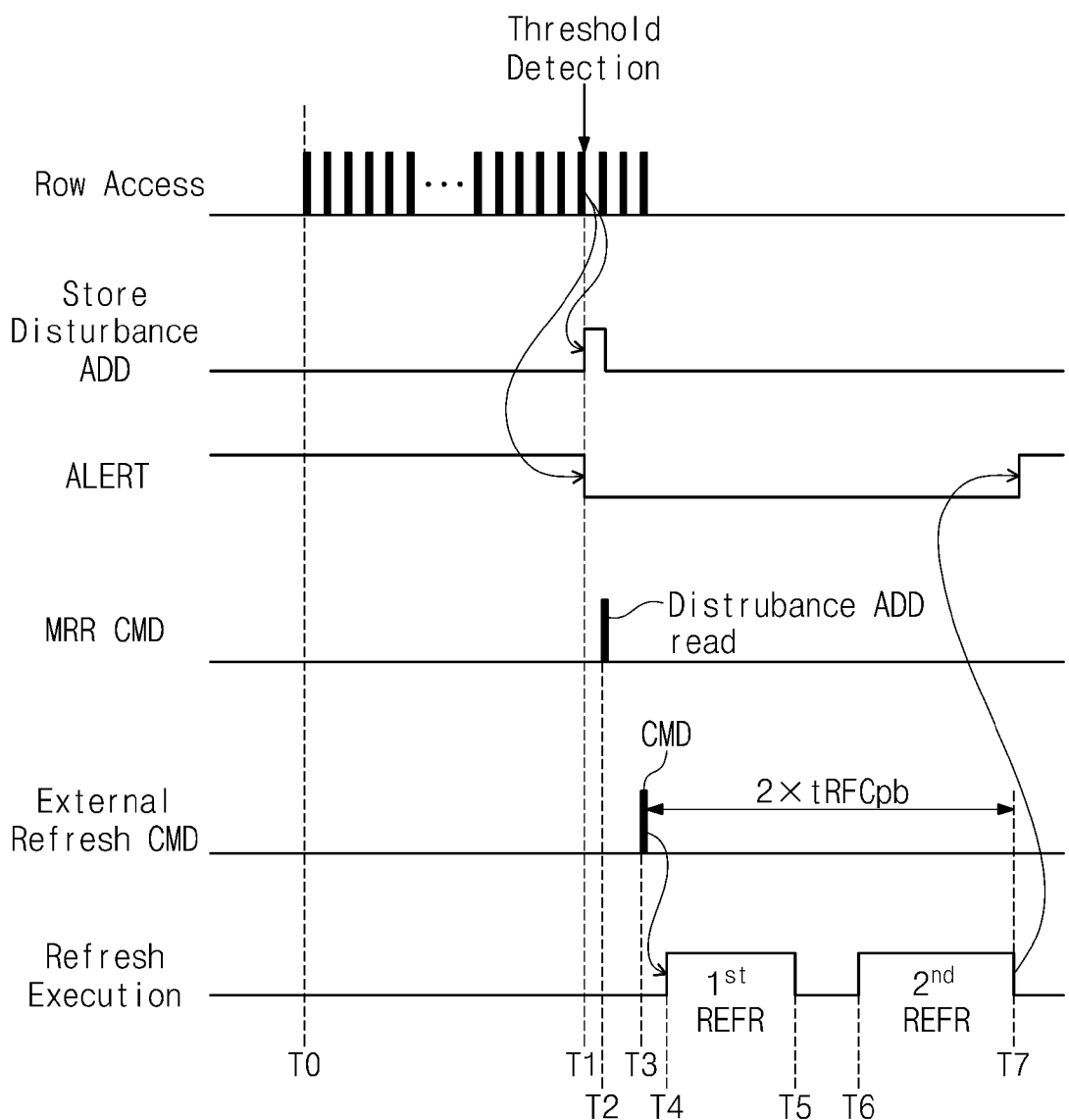
FIG. 21 is a timing diagram illustrating the refresh method of FIG. 20 according to the eighth embodiment.

FIG. 21 is a timing diagram illustrating the refresh method of FIG. 20 according to the eighth embodiment. Referring to FIG. 21, the volatile memory device 100 performs a per bank refresh operation in response to an external refresh command at the time of when an alert signal ALERT occurs.

A time T0 represents a time of when an operation for counting the number of dynamic disturbances DDN starts. The disturbance detector 180 of FIG. 3 starts an operation for counting the number of accesses on a specific memory area at the time T0. Exemplarily, it is assumed that the disturbance detector 180 counts the number of accesses on one row or word line. The number of accesses on one word line may be measured by counting the number of active commands for a specific period of time.

At a time T1, the number of dynamic disturbances DDN counted by the disturbance detector 180 reaches a threshold. The disturbance detector 180 generates a detect signal DET.

Then, address information on a memory area exposed to disturbance (for example, a specific row) is stored in a register set. For example, address information on a memory area exposed to disturbance may be stored in the disturbance address register 167 of FIG. 6 in the refresh control logic 160.

Also, the alert generator 190 of FIG. 3 outputs an alert signal ALERT as a logic 'Low' at the time T1. Here, the alert signal ALERT may be outputted through an additional pin or may be outputted as status data to the outside. Through the alert signal ALERT, information that disturbance on a specific memory area reaches a threshold may be delivered to the outside of the volatile memory device 100.

At a time T2, the memory controller 200 of FIG. 2 provides a mode register read command MRR CMD in response to the alert signal ALERT. Then, address information on a memory area exposed to disturbance, which is stored in a register, may be provided to the memory controller 200. The memory controller 200 may freely access memory banks that are not to be refreshed.

At a time T3, the memory controller 200 provides a refresh command CMD. The refresh command CMD may be provided through control signals /CAS, /RAS, and /WE. Then, at a time T4, the refresh control logic 160 of the volatile memory device 100 performs a first refresh operation 1st REFR on a first word line exposed to disturbance. The first refresh operation 1st REFR may be performed on only one bank stored in a register. The first refresh operation 1st REFR is completed at a time T5.

At a time T6, the refresh control logic 160 of the volatile memory device 100 performs a second refresh operation 2nd REFR on a second word line exposed to disturbance on a selected memory bank without an additional command. The second refresh operation 2nd REFR is completed at a time T7. The alert signal ALERT is shifted into a logic 'High' at the time T7 of when the second refresh operation 2nd REFR is completed.

When two times of the per bank refresh operation is completed in response to an external command of the volatile memory device 100, the following active command ACT or a pre-charge command may be provided. Furthermore, a count value of the number of dynamic disturbances DDN on a monitored specific memory area is reset.

Figure 22:
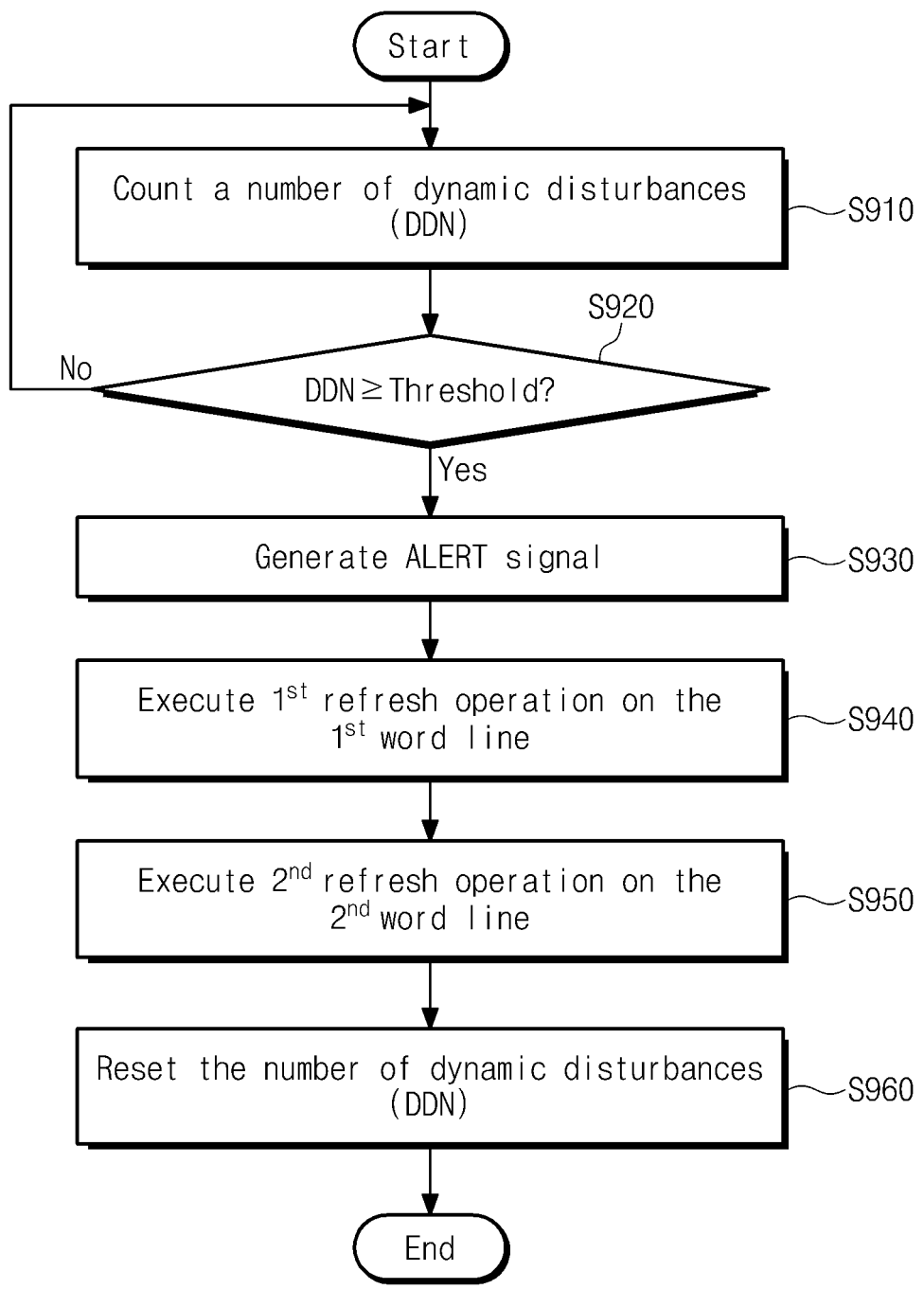
FIG. 22 is a flowchart illustrating a refresh method of a volatile memory device according to a ninth embodiment.

FIG. 22 is a flowchart illustrating a refresh method of a volatile memory device according to a ninth embodiment. Referring to FIG. 22, when it is detected that a number of disturbances on a specific memory area reaches a threshold, the volatile memory device 100 outputs an alert signal ALERT and receives a one-time refresh command. For example, the volatile memory device 100 may perform a refresh operation on a memory area exposed to disturbance without providing an external command.

In operation S910, the volatile memory device 100 of FIG. 3 counts the number of dynamic disturbances DDN on a specific memory area. For example, the volatile memory device 100 may count a number of active commands on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S920, the volatile memory device 100 compares the number of counted dynamic disturbances DDN with a threshold. When the number of dynamic disturbances DDN is equal to or greater than a threshold within a predetermined time, it proceeds to operation S930 for generating an alert signal ALERT. On the contrary, when the number of dynamic disturbances DDN is less than a threshold within a predetermined time, it proceeds to operation S910 for continuously monitoring the number of dynamic disturbances DDN.

In operation S930, the alert generator 190 of FIG. 3 generates an alert signal ALERT in response to a detect signal DET from the disturbance detector 180. The alert generator 190 may output an alert signal ALERT in a pulse form to the outside of the volatile memory device 100.

In operation S940, the memory controller 200 performs a first refresh operation on a first word line exposed to disturbance by itself without receiving an external command. That is, the volatile memory device 100 performs a refresh operation on the first word line. Address information on the first word line may be provided by the disturbance address register 167 of FIG. 4.

In operation S950, the volatile memory device 100 performs a second refresh operation on a second line exposed to disturbance. Address information on the second word line may be provided by the disturbance address register 167. For example, the first word line and the second word line may be word lines adjacent to a word line where the number of accesses (or, the number of active commands) reaches a threshold. Also, the first and second refresh operations may be performed as an all bank refresh operation or a per bank refresh operation.

In operation S960, a count value of the number of dynamic disturbances DDN on a memory area where data are rewritten through a refresh operation is reset.

The refresh method of the volatile memory device 100 to output an alert signal ALERT to the outside and refresh a memory area exposed to disturbance without a refresh command from the outside was described above.

Figure 23:
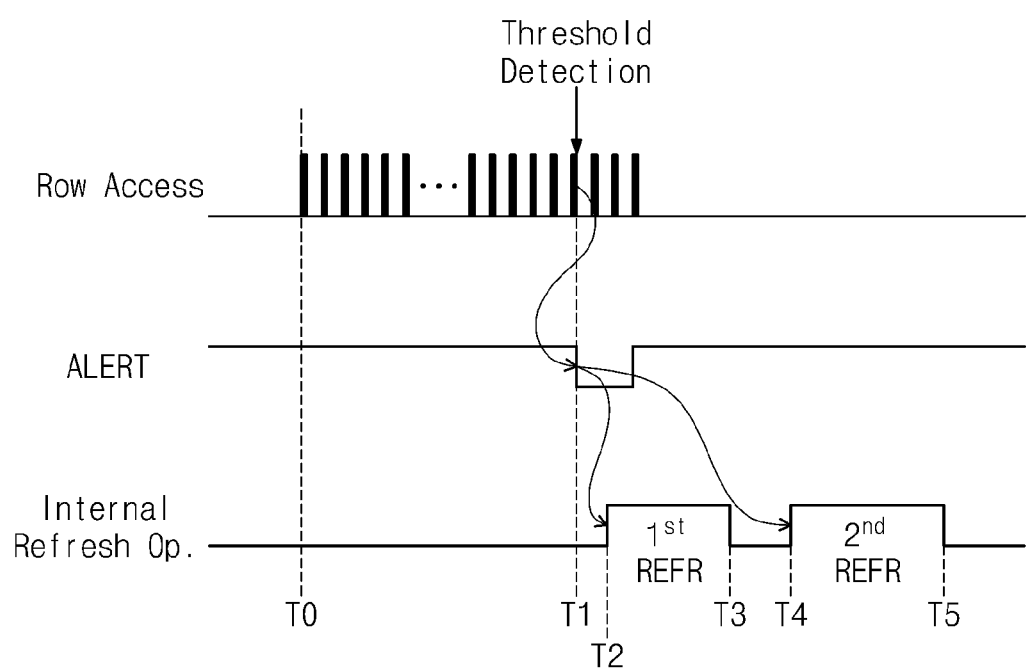
FIG. 23 is a timing diagram illustrating the refresh method of FIG. 22 according to the ninth embodiment.

FIG. 23 is a timing diagram illustrating the refresh method of FIG. 22 according to the ninth embodiment. Referring to FIG. 23, the volatile memory device 100 outputs an alert signal ALERT and then performs a refresh operation on a memory area exposed to disturbance by itself.

A time T0 represents a time of when an operation for counting the number of dynamic disturbances DDN starts. The disturbance detector 180 of FIG. 3 starts an operation for counting the number of accesses on a specific memory area at the time T0. For example, it is assumed that the disturbance detector 180 counts the number of accesses on one row. The number of accesses to one row may be measured by counting the number of applying an active command ACT.

At a time T1, the number of dynamic disturbances DDN counted by the disturbance detector 180 reaches a threshold. Then, the disturbance detector 180 generates a detect signal DET. Thus, the alert generator 190 of FIG. 3 outputs an alert signal ALERT in a pulse form.

At a time T2, the refresh control logic 160 of the volatile memory device 100 performs a first refresh operation 1st REFR on a first word line exposed to disturbance. The first refresh operation 1st REFR is completed at a time T3.

At a time T4, the refresh control logic 160 of the volatile memory device 100 performs a second refresh operation 2nd REFR on a second word line exposed to disturbance. The second refresh operation 2nd REFR is completed at a time T5.

When two times of the refresh operation is completed in response to an external command of the volatile memory device 100, the following active command ACT or a pre-charge command may be provided. Furthermore, a count value of the number of dynamic disturbances DDN on a monitored specific memory area is reset. This operation is performed in the disturbance detector 180.

As mentioned above, the refresh method of the volatile memory device 100 to output an alert signal ALERT to the outside and perform a refresh operation by itself when the number of disturbances in a memory area reaches a threshold was described. Furthermore, the memory controller 200 may refer to an alert signal ALERT during an access operation or a memory management operation.

Figure 24:
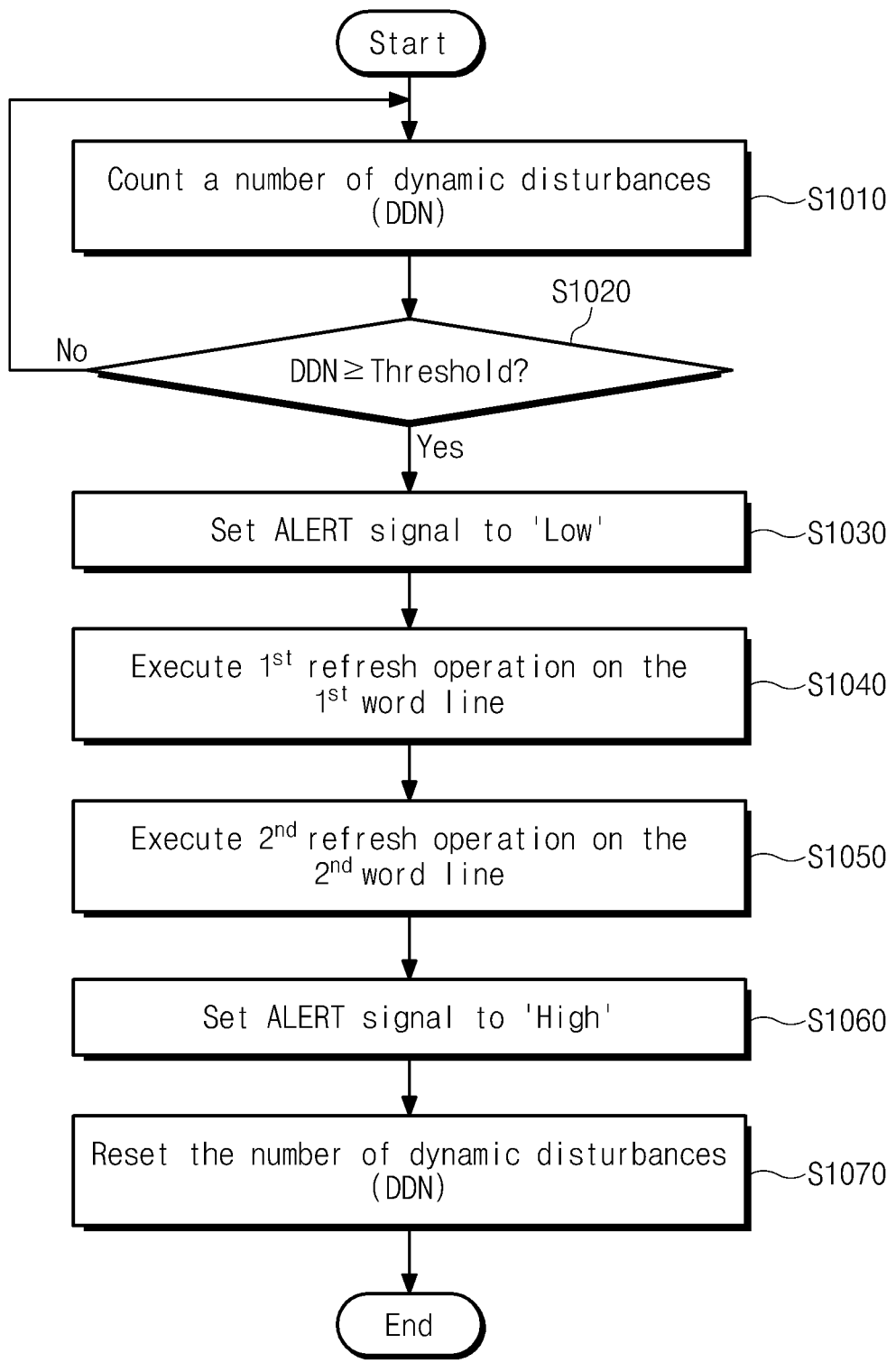
FIG. 24 is a flowchart illustrating a refresh method of a volatile memory device according to a tenth embodiment.

FIG. 24 is a flowchart illustrating a refresh method of a volatile memory device according to a tenth embodiment. Referring to FIG. 24, when it is detected that a number of disturbances on a specific memory area reaches a threshold, the volatile memory device 100 shifts a level of an alert signal ALERT into a logic 'Low'. Then, once a refresh operation on a memory area exposed to disturbance is completed, the volatile memory device 100 shifts a level of an alert signal ALERT into a logical 'High'. The volatile memory device 100 may perform a refresh operation on a memory area exposed to disturbance by itself without providing an external command.

In operation S1010, the volatile memory device 100 of FIG. 3 counts the number of dynamic disturbances DDN on a specific memory area. For example, the volatile memory device 100 may count a number of active commands on a specific memory area. In one embodiment, a unit for counting the number of active commands may be one word line. In one embodiment, a unit for counting the number of active commands may be a word line group unit including a plurality of word lines, a block unit, a bank unit, or a chip unit.

In operation S1020, the volatile memory device 100 compares the number of counted dynamic disturbances DDN with a threshold. When the number of dynamic disturbances DDN is equal to or greater than a threshold within a predetermined time, it proceeds to operation S1030. On the contrary, when the number of dynamic disturbances DDN is less than a threshold within a predetermined time, it proceeds to operation S1010 for continuously monitoring the number of dynamic disturbances DDN.

In operation S1030, the alert generator 190 of FIG. 3 shifts an alert signal ALERT into a logic 'Low' in response to a detect signal DET from the disturbance detector 180.

In operation S1040, the volatile memory device 100 performs a first refresh operation on a first word line exposed to disturbance by itself without an external command. For example, the volatile memory device 100 performs a refresh operation on the first word line. Address information on the first word line is provided by the disturbance address register 167 of FIG. 4.

In operation S1050, the volatile memory device 100 performs a second refresh operation on a second line exposed to disturbance. Address information on the second word line may be provided by the disturbance address register 167. For example, the first word line and the second word line may be word lines adjacent to a word line where the number of accesses (or, the number of active commands) reaches a threshold. Also, the first and second refresh operations may be performed as an all bank refresh operation or a per bank refresh operation.

In operation S1060, the alert generator 190 shifts an alert signal ALERT into a logic 'High' in response to the completion of a refresh operation on a memory area exposed to disturbance.

In operation S1070, a count value of the number of dynamic disturbances DDN on a memory area where data are rewritten through a refresh operation is reset.

As mentioned above, provided is a refresh method of a volatile memory device to provide to the outside information on whether there is disturbance in a specific memory area and whether a refresh operation on a specific memory area is completed. Especially, a refresh operation may be performed in the volatile memory device 100 without an external command.

Figure 25:
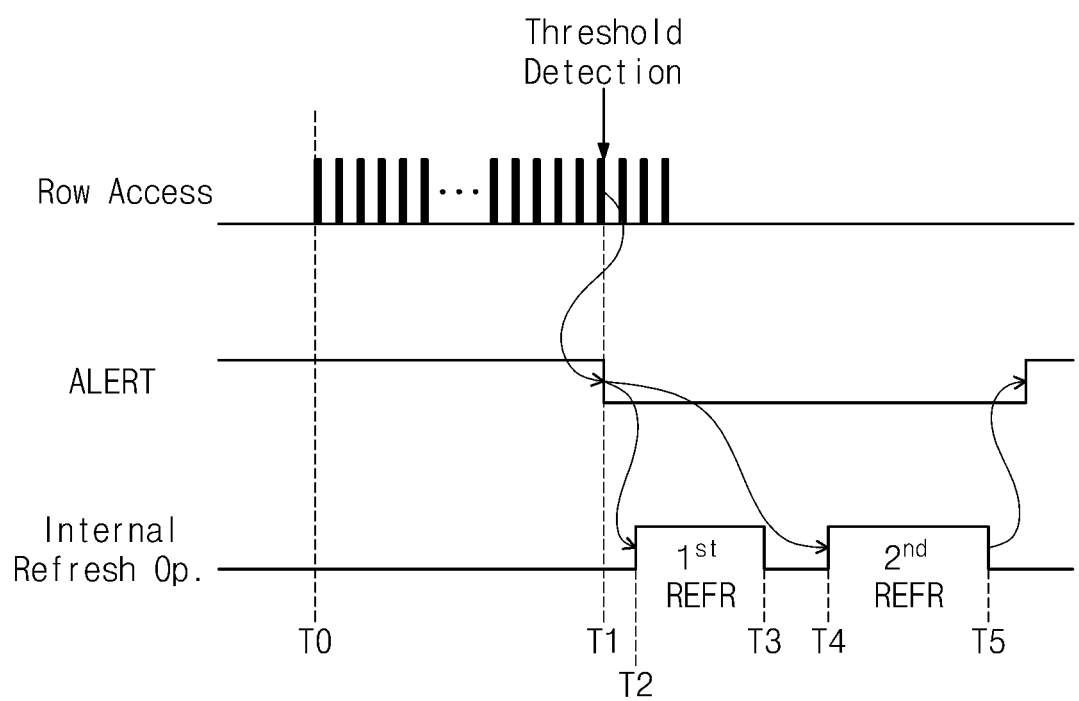
FIG. 25 is a timing diagram illustrating the refresh method of FIG. 24 according to the tenth embodiment.

FIG. 25 is a timing diagram illustrating the refresh method of FIG. 24 according to the tenth embodiment. Referring to FIG. 25, the volatile memory device 100 outputs an alert signal ALERT and then performs a refresh operation on a memory area exposed to disturbance by itself.

A time T0 represents a time of when an operation for counting the number of dynamic disturbances DDN starts. The disturbance detector 180 of FIG. 3 starts an operation for counting the number of accesses on a specific memory area at the time T0. For example, it is assumed that the disturbance detector 180 counts the number of accesses on one row. The number of accesses to one row may be measured by counting the number of applying an active command ACT.

At a time T1, the number of dynamic disturbances DDN counted by the disturbance detector 180 reaches a threshold. Then, the disturbance detector 180 generates a detect signal DET. Thus, the alert generator 190 of FIG. 3 shifts a level of an alert signal ALERT into a logic 'Low'.

At a time T2, the refresh control logic 160 of the volatile memory device 100 performs a first refresh operation 1st REFR on a first word line exposed to disturbance. The first refresh operation 1st REFR is completed at a time T3.

At a time T4, the refresh control logic 160 of the volatile memory device 100 performs a second refresh operation 2nd REFR on a second word line exposed to disturbance. When the second refresh operation 2nd REFR is completed at a time T5, the alert generator 190 shifts an alert signal ALERT into a logic 'High'.

The refresh method of the volatile memory device 100 to shift a level of an alert signal ALERT but perform a refresh operation by itself without an external command when the number of disturbances on a memory area reaches a threshold was described above.

Figure 26:
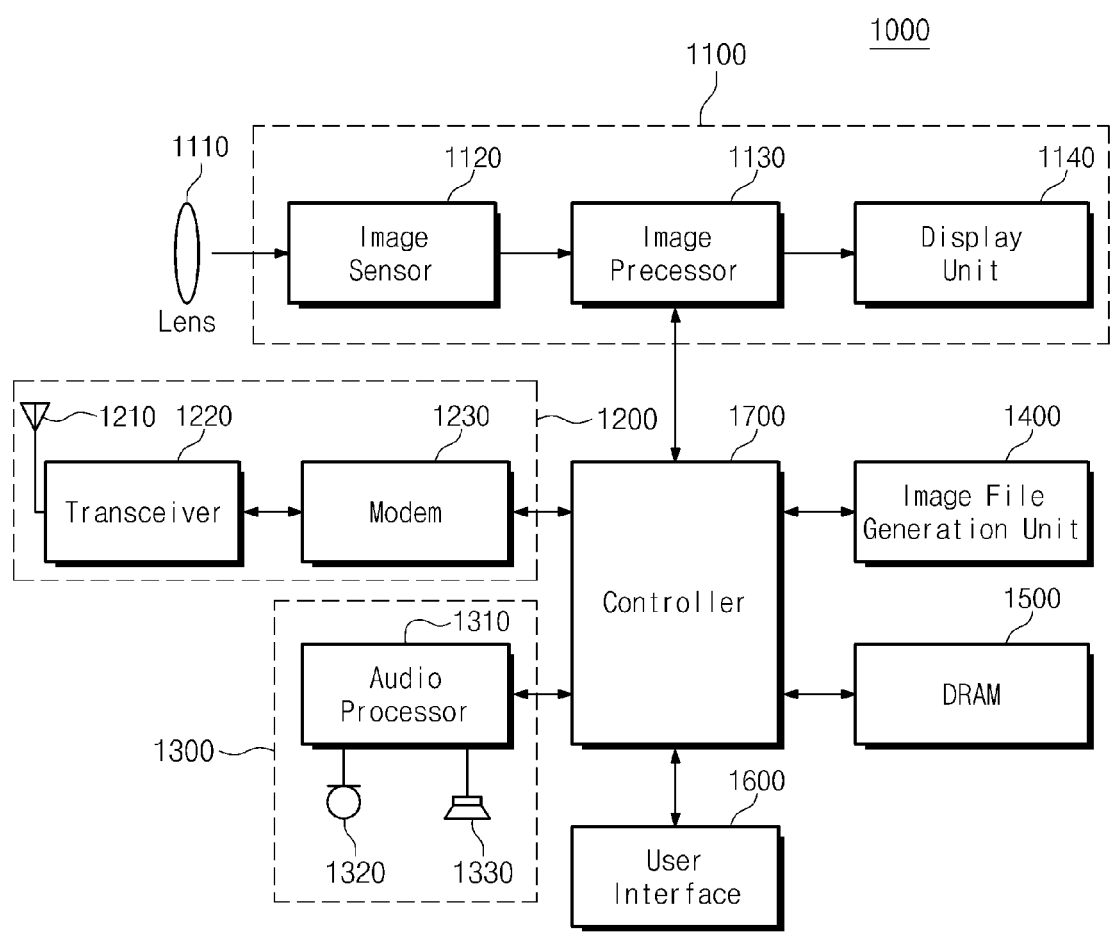
FIG. 26 is a block diagram illustrating a portable terminal including a volatile memory device according to certain embodiments.

FIG. 26 is a block diagram illustrating a portable terminal including a volatile memory device according to certain embodiments. Referring to FIG. 26, the portable terminal 1000 includes an image processing unit 1100, a wireless transceiving unit 1200, an audio processing unit 1300, an image file generating unit 1400, a DRAM 1500, a user interface 1600, and a controller 1700.

The image processing unit 1100 includes a lens 1110, an image sensor 1120, an image processor 1130, and a display unit 1140. The wireless transceiving unit 1200 includes an antenna, a transceiver 1220, and a modem 1230. The audio processing unit 1300 includes an audio processor 1310, a mike 1320, and a speaker 1330. The image file generating unit 1400 is a component for generating an image file in the portable terminal 1000. The DRAM is provided as a working memory of the portable terminal 1000. The user interface 1600 is a component for receiving a user input signal.

Here, the DRAM 1500 may be provided as a mobile DRAM. The DRAM 1500 may be the volatile memory device disclosed above. For example, the DRAM 1500 may output an alert signal ALERT to the controller 1700 when the number of disturbances on a specific area reaches a threshold. Moreover, a refresh operation may be performed on a memory area exposed to disturbance by itself or in response to a command from the controller 1700. According to such a refresh operation, the DRAM 1500 may provide high data reliability and low power consumption.

A semiconductor memory device according to disclosed embodiments may be mounted in various types of packages. Examples of the packages of the nonvolatile memory device 200 or the memory system 10 include such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to various embodiments provided is a volatile memory device requesting a refresh command to itself or the outside according to a number of disturbances. Especially, in the case of memory system in which a refresh operation controlled from the outside is performed intensively during a specific period of time, the memory system may receive a refresh command from itself or the outside through the refresh method of the disclosed embodiments. Therefore, according to the volatile memory device and a refresh method thereof, even when disturbance occurs intensively in a specific address, a refresh operation is possible and data retention characteristics may be improved.

The above-disclosed embodiments are to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A refresh method of a volatile memory device, the method comprising:
    detecting a number of disturbances that affect a second memory area as the number of accesses to a first memory area is increased;
    outputting an alert signal from the volatile memory device to an outside of the volatile memory device when the detected number of disturbances reaches a reference value; and
    performing a refresh operation on the second memory area in response to the alert signal.

2. The method of claim 1, wherein performing the refresh operation on the second memory area includes receiving a refresh command provided from a memory controller in response to the alert signal.

3. The method of claim 1, wherein performing the refresh operation on the second memory area comprises:
    performing a refresh operation on memory cells connected to a first word line of the second memory area; and
    performing a refresh operation on memory cells connected to a second word line of the second memory area,
    wherein the second memory area is located adjacent to the first memory area.

4. The method of claim 1, wherein performing the refresh operation on the second memory area includes:
    receiving a first refresh command provided from a memory controller in response to the alert signal; and
    receiving a second refresh command subsequently to the first refresh command from the memory controller.

5. The method of claim 4, wherein performing the refresh operation on the second memory area comprises:
    performing a refresh operation on memory cells connected to a first word line of the second memory area in response to the first refresh command; and
    performing a refresh operation on memory cells connected to a second word line of the second memory area in response to the second refresh command,
    wherein the second memory area is located adjacent to the first memory area.

6. The method of claim 1, further comprising:
    storing an address related to the first memory area or the second memory area in a register,
    wherein performing the refresh operation on the second memory area includes outputting the address by receiving a mode register read command from the outside of the volatile memory device.

7. The method of claim 6, further comprising:
    after receiving the mode register read command, receiving at least a one-time refresh command provided from a memory controller.

8. The method of claim 1, wherein the volatile memory device is a first chip, and outputting the alert signal from the volatile memory device to the outside of the volatile memory device includes outputting the alert signal from the first chip to a second chip.

9. The method of claim 1, wherein the alert signal is outputted as a pulse signal having a specific pulse width.

10. The method of claim 1, wherein
    the alert signal is shifted from a first logic level to a second logic level when the detected number of disturbances reaches the reference value, and is shifted from the second logic level to the first logic level when the refresh operation on the second memory area is completed.

11. The method of claim 1, wherein the number of disturbances that affects the second memory area corresponds to a number of active commands on the first memory area.

12. A volatile memory device comprising:
    a cell array including a plurality of DRAM cells;
    a disturbance detector configured to count a number of accesses to a first memory area of the cell array and generate a detect signal when the number of the counted accesses reaches a reference value;
    a refresh control logic configured to, in response to the detect signal, perform a refresh operation on a second memory area and a third memory area of the cell array, each being located adjacent to the first memory area; and
    an alert generator configured to, in response to the detect signal, output an alert signal from the volatile memory device to an outside of the volatile memory device.

13. The volatile memory device of claim 12, wherein the refresh control logic is configured to perform the refresh operation on the second and third memory areas either in response to a refresh command provided from the outside of the volatile memory device, or without a refresh command from the outside of the volatile memory device.

14. The volatile memory device of claim 13, wherein the disturbance detector is configured to count the number of accesses on the first memory area for a specific period of time.

15. The volatile memory device of claim 13, wherein the alert signal is shifted from a first logic level to a second logic level in response to the detect signal, and is shifted from the second logic level to the first logic level when the refresh operation on the second memory area and the third memory area is completed.

16. A method of operating a memory device including a memory cell array, the method comprising:
    counting a number of times that a first set of memory cells of the memory cell array is accessed during a first time period;
    when the counted number of times equals to a reference number is detected, activating an alert signal for a period of time and outputting the alert signal from the memory device to the outside of the memory device; and performing a refresh operation on a second set of memory cells of the memory cell array, wherein the second set of memory cells is located adjacent to the first set of memory cells.

17. The method of claim 16, wherein when the alert signal is output, performing the refresh operation on the second set of memory cells occurs by receiving a refresh command from an outside of the memory device.

18. The method of claim 17, further comprising:

storing an address related to the second set of memory cells in a register, wherein performing the refresh operation on the second set of memory cells includes outputting the address by receiving a mode register read command from an outside of the memory device.

19. The method of claim 16, wherein when the alert signal is output, performing the refresh operation on the second set of memory cells occurs by receiving a refresh command generated internally in the memory device.

20. The method of claim 16, wherein the period of time of the activated alert signal includes either a first period of time regardless of performing the refresh operation on the second set of memory cells or a second period of time that depends on performing the refresh operation on the second set of memory cells.

* * * * *